(12) United States Patent
Kaneyama et al.

(10) Patent No.: US 7,726,891 B2
(45) Date of Patent: Jun. 1, 2010

(54) SUBSTRATE PROCESSING APPARATUS AND SUBSTRATE PROCESSING METHOD

(75) Inventors: Koji Kaneyama, Kyoto (JP); Akihiro Hisai, Kyoto (JP); Toru Asano, Kyoto (JP); Hiroshi Kobayashi, Kyoto (JP)

(73) Assignee: Sokudo Co., Ltd., Kyoto (JP)

( * ) Notice: Subject to any disclaimer, the term of this patent is extended or adjusted under 35 U.S.C. 154(b) by 819 days.

(21) Appl. No.: 11/273,439

(22) Filed: Nov. 10, 2005

(65) Prior Publication Data

US 2006/0104635 A1   May 18, 2006

(30) Foreign Application Priority Data

Nov. 11, 2004   (JP)   ............... 2004-327918

(51) Int. Cl.
G03D 5/00 (2006.01)
G03B 27/32 (2006.01)
B05C 11/00 (2006.01)

(52) U.S. Cl. .................. 396/611; 355/27; 118/696; 414/935

(58) Field of Classification Search ............... 396/611; 355/27, 30; 414/935; 118/500, 503, 52, 118/58, 696; 430/326, 327, 396
See application file for complete search history.

(56) References Cited

U.S. PATENT DOCUMENTS

| | | | |
|---|---|---|---|
| 6,051,101 A * | 4/2000 | Ohtani et al. | 156/345.32 |
| 6,097,469 A * | 8/2000 | Yaegashi et al. | 355/30 |
| 6,632,281 B2 | 10/2003 | Kitano et al. | |
| 6,893,171 B2 * | 5/2005 | Fukutomi et al. | 396/611 |
| 7,208,066 B2 | 4/2007 | Kitano et al. | |
| 7,371,510 B2 | 5/2008 | Hirayama et al. | |
| 7,401,988 B2 | 7/2008 | Katano et al. | |
| 2003/0034458 A1 * | 2/2003 | Isoda et al. | 250/484.4 |
| 2003/0213431 A1 * | 11/2003 | Fukutomi et al. | 118/696 |
| 2006/0141400 A1 | 6/2006 | Hirayama et al. | |
| 2007/0122551 A1 * | 5/2007 | Yamamoto et al. | 427/240 |
| 2007/0128356 A1 | 6/2007 | Matsuyama et al. | |
| 2007/0177869 A1 * | 8/2007 | Yamamoto et al. | 396/611 |

FOREIGN PATENT DOCUMENTS

JP   2001-308005   11/2001

(Continued)

OTHER PUBLICATIONS

Translation of Japanese Office Action (dated Jun. 24, 2009).*

(Continued)

*Primary Examiner*—Alan A Mathews
(74) *Attorney, Agent, or Firm*—Townsend and Townsend and Crew LLP

(57) ABSTRACT

A substrate processing apparatus comprises an indexer block, an anti-reflection film processing block, a resist film processing block, a development processing block, a resist cover film processing block, a resist cover film removal block, and an interface block. An exposure device is arranged adjacent to the interface block. A resist film is formed on a substrate in the resist film processing block. A resist cover film is formed on the resist film in the resist cover film processing block before the substrate is subjected to exposure processing by the exposure device.

10 Claims, 13 Drawing Sheets

FOREIGN PATENT DOCUMENTS

| | | |
|---|---|---|
| JP | 2003-324139 | 11/2003 |
| JP | 2005-197469 | 7/2005 |
| JP | 2005-294520 | 10/2005 |
| JP | 2006-080404 | 3/2006 |
| WO | WO/99-49504 | 9/1999 |
| WO | 2004/074937 | 9/2004 |

OTHER PUBLICATIONS

Office Action of Japanese Application No. 2004-327918, dated May 13, 2009, 4 pages total.

* cited by examiner

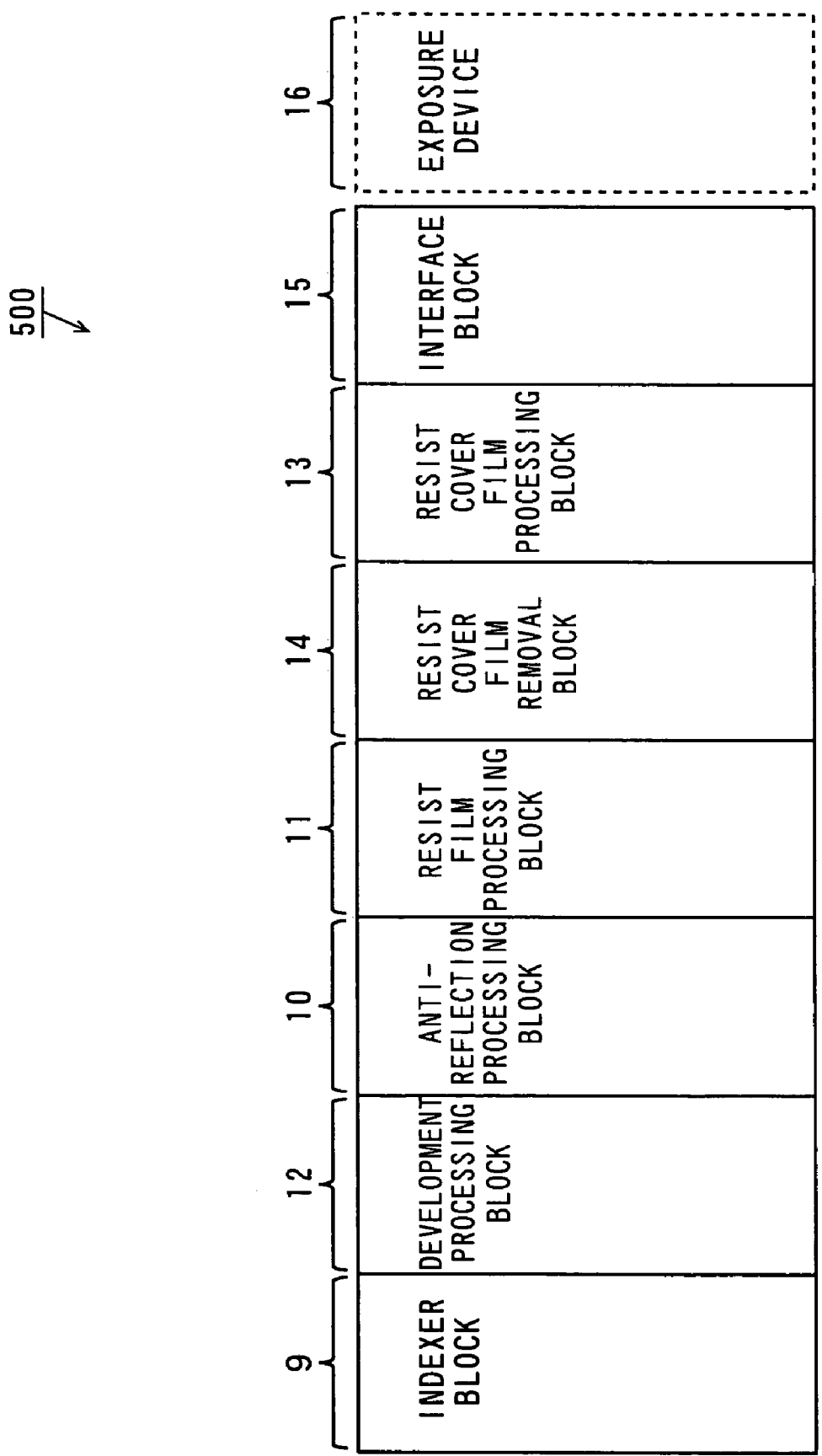
F I G. 1 2

SUBSTRATE PROCESSING APPARATUS AND SUBSTRATE PROCESSING METHOD

CROSS REFERENCE TO A RELATED APPLICATION

The present application is related to the following four applications filed Nov. 10, 2005, and commonly owned: 1) SUBSTRATE PROCESSING APPARATUS AND SUBSTRATE PROCESSING METHOD, U.S. patent application Ser. No. 11/273,463; 2) SUBSTRATE PROCESSING APPARATUS AND SUBSTRATE PROCESSING METHOD, U.S. patent application Ser. No. 11/273,440; 3) SUBSTRATE PROCESSING APPARATUS AND SUBSTRATE PROCESSING METHOD, U.S. patent application Ser. No. 11/273,465; 4) SUBSTRATE PROCESSING APPARATUS AND SUBSTRATE PROCESSING METHOD, U.S. patent application Ser. No. 11/273,441.

BACKGROUND OF THE INVENTION

1. Field of the Invention

The present invention relates to a substrate processing apparatus and a substrate processing method for applying processing to substrates.

2. Description of the Background Art

A substrate processing apparatus is used to apply a variety of processings to substrates such as semiconductor substrates, substrates for use in liquid crystal displays, plasma displays, optical disks, magnetic disks, magneto-optical disks, photomasks, and other substrates.

Such a substrate processing apparatus typically applies a plurality of successive processings to a single substrate. The substrate processing apparatus as described in JP 2003-324139 A comprises an indexer block, an anti-reflection film processing block, a resist film processing block, a development processing block, and an interface block. An exposure device is arranged adjacent to the interface block as an external device separate from the substrate processing apparatus.

In the above-described substrate processing apparatus, a substrate is carried from the indexer block into the anti-reflection film processing block and the resist film processing block, where the formation of an anti-reflection film and resist film coating processing are applied to the substrate. The substrate is then transported to the exposure device through the interface block. After exposure processing has been applied to the resist film on the substrate by the exposure device, the substrate is transported to the development processing block through the interface block. In the development processing block, development processing is applied to the resist film on the substrate to form a resist pattern thereon, and the substrate is subsequently carried into the indexer block.

With recent improvements in the density and integration of devices, making finer resist patterns have become very important. Conventional exposure devices typically perform exposure processing by providing reduction projection of a reticle pattern on a substrate through a projection lens. With such conventional exposure devices, however, the line width of an exposure pattern is determined by the wavelength of the light source of an exposure device, thus making it impossible to make a resist pattern finer than that.

For this reason, a liquid immersion method is suggested as a projection exposure method allowing for finer exposure patterns (refer to, e.g., WO99/49504 pamphlet). In the projection exposure device according to the WO99/49504 pamphlet, a liquid is filled between a projection optical system and a substrate, resulting in a shorter wavelength of exposure light on a surface of the substrate. This allows for a finer exposure pattern.

However, in the projection exposure device according to the aforementioned WO99/49504 pamphlet, exposure processing is performed with the substrate and the liquid being in contact with each other. Accordingly, part of the component of a resist applied on the substrate elutes in the liquid. The resist components eluted in the liquid remain on a surface of the substrate, which may become the cause of a defect.

The resist components eluted in the liquid contaminate the lens of the exposure device. This may cause a defective dimension and a defective shape of the exposure pattern.

SUMMARY OF THE INVENTION

It is an object of the invention to provide a substrate processing apparatus and a substrate processing method capable of preventing a component of a photosensitive material on a substrate from being eluted in a liquid in an exposure device.

A substrate processing apparatus according to one aspect of the invention that is arranged adjacent to an exposure device comprises a processing section for applying processing to a substrate and an interface that is provided on one end of the processing section for exchanging the substrate between the processing section and the exposure device, wherein the interface includes a transport device that transports the substrate between the processing unit and the exposure device, and the processing unit includes a first processing unit that forms a photosensitive film made of a photosensitive material on the substrate, a second processing unit that forms a protective film for protecting the photosensitive film on the substrate before exposure processing by the exposure device, and a third processing unit that applies development processing to the substrate after the exposure processing by the exposure device.

In the substrate processing apparatus, the photosensitive film is formed on the substrate by the first processing unit. Then, the protective film is formed on the photosensitive film by the second processing unit. The substrate is subsequently transported to the exposure device from the processing section by the transport device in the interface, where the substrate is subjected to the exposure processing. The substrate after the exposure processing is transported to the processing section from the exposure device by the transport device in the interface, and subjected to the development processing by the third processing unit.

In this way, the protective film is formed on the photosensitive film by the second processing unit before the exposure processing is performed by the exposure device. This prevents, even if the substrate in contact with a liquid is subjected to the exposure processing by the exposure device, a component of the photosensitive material from being eluted in the liquid. This also reduces contamination in the exposure device while preventing the component of the photosensitive material from remaining on a surface of the substrate. As a result, processing defects in the substrate that may be generated in the exposure device can be reduced.

A processing section may comprise a first processing block that includes the first processing unit, a first thermal processing unit that thermally treats the substrate, and a first transport unit that transports the substrate; a second processing block that includes the second processing unit, a second thermal processing unit that thermally treats the substrate, and a second transport unit that transports the substrate; and a third processing block that includes the third processing unit, a third thermal processing unit that thermally treats the substrate, and a third transport unit that transports the substrate.

In this case, the photosensitive film is formed on the substrate by the first processing unit in the first processing block. Then, the substrate is transported to the first thermal processing unit by the first transport unit, where the substrate is subjected to given thermal treatment. The substrate is subsequently transported to an adjacent other processing block by the first transport unit.

Next, in the second processing block, the protective film is formed on the photosensitive film on the substrate by the second processing unit. Then, the substrate is transported to the second thermal processing unit by the second transport unit, where the substrate is subjected to given thermal treatment. The substrate is subsequently transported to an adjacent other processing block by the second transport unit.

Then, the substrate is transported to the exposure device from the processing section by the transport device in the interface, where the substrate is subjected to the exposure processing. The substrate after the exposure processing is transported to the processing section from the exposure device by the transport device in the interface.

Then, in the third processing block, the substrate is subjected to the development processing by the third processing unit. The substrate is subsequently transported to the third thermal processing unit by the third transport unit, and subjected to given thermal treatment by the third thermal processing unit. Then, the substrate is transported to an adjacent other processing block by the third transport unit.

In the substrate processing apparatus, processing contents are divided for each processing block. Therefore, the addition of the second processing block to an existing substrate processing apparatus having the first and third processing blocks enables the formation of a protective film on a photosensitive film by the second processing block before the exposure processing is performed by the exposure device. This results in reduced processing defects in the substrate that may be generated in the exposure device.

The processing section may further comprise a fourth processing unit that removes the protective film after the exposure processing by the exposure device and before the development processing by the third processing unit.

This ensures the removal of the protective film by the fourth processing unit before the substrate is subjected to the development processing by the third processing unit, which allows the development processing to be reliably applied to the substrate.

The processing section may comprise a first processing block that includes the first processing unit, a first thermal processing unit that thermally treats the substrate, and a first transport unit that transports the substrate; a second processing block that includes the second processing unit, a second thermal processing unit that thermally treats the substrate, and a second transport unit that transports the substrate; a third processing block that includes the third processing unit, a third thermal processing unit that thermally treats the substrate, and a third transport unit that transports the substrate; and a fourth processing block that includes the fourth processing unit and a fourth transport unit that transports the substrate.

In this case, the photosensitive film is formed on the substrate by the first processing unit in the first processing block. Then, the substrate is transported to the first thermal processing unit by the first transport unit, where the substrate is subjected to given thermal treatment. The substrate is subsequently transported to an adjacent other processing block by the first transport unit.

Next, in the second processing block, the protective film is formed on the photosensitive film on the substrate by the second processing unit. Then, the substrate is transported to the second thermal processing unit by the second transport unit, where the substrate is subjected to given thermal treatment. The substrate is subsequently transported to an adjacent other processing block by the second transport unit.

Then, the substrate is transported to the exposure device from the processing section by the transport device in the interface, where the substrate is subjected to the exposure processing. The substrate after the exposure processing is transported to the processing section from the exposure device by the transport device in the interface.

Then, the protective film is removed by the fourth processing unit in the fourth processing block. The substrate is subsequently transported to an adjacent other processing block by the fourth transport unit.

After this, in the third processing block, the substrate is subjected to the development processing by the third processing unit. Then, the substrate is transported to the third thermal processing unit by the third transport unit, where the substrate is subjected to given thermal treatment. The substrate is subsequently transported to an adjacent other processing block.

In the substrate processing apparatus, processing contents are divided for each processing block. Therefore, the addition of the second and fourth processing blocks to an existing substrate processing apparatus having the first and third processing blocks enables the formation of a protective film on a photosensitive film by the second processing block before the exposure processing is performed by the exposure device while enabling the removal of the protective film by the fourth processing unit after the exposure processing and before the development processing. As a result, processing defects in the substrate that may be generated in the exposure device can be reduced at low cost while the development processing can be reliably applied to the substrate.

The third processing block may be arranged on another end of the processing section. In this case, the plurality of processing blocks except the third processing block are arranged adjacent to one another. This enables a simplified configuration of piping, even if separate pipes have to be used for discharging the liquid from the third processing block and for discharging the liquids from the other processing blocks.

The protective film may be made of fluororesin. This ensures the protection of the photosensitive film.

The interface may further include a fifth processing unit that applies given processing to the substrate and a platform on which the substrate is temporarily mounted, and the transport device may include a fifth transport unit that transports the substrate between the processing section, the fifth processing unit, and the platform, and a sixth transport unit that transports the substrate between the platform and the exposure device. In this case, the substrate is transported to the fifth processing unit from the processing section by the fifth transport unit. The substrate is subjected to the given processing by the fifth processing unit, and then transported to the platform by the fifth transport unit. After this, the substrate is transported to the exposure device from the platform by the sixth transport unit. The substrate is subjected to the exposure processing by the exposure device, and then transported to the platform from the exposure device by the sixth transport unit. After this, the substrate is transported to the processing section from the platform by the fifth transport unit.

The disposition of the fifth processing unit in the interface and the transport of the substrate by the two transport units enables the addition of processing contents without increasing the footprint of the substrate processing apparatus.

The fifth transport unit may comprise first and second holders for holding the substrate, and wherein the fifth transport unit may hold the substrate with the first holder when transporting the substrate before the exposure processing by the exposure device and may hold the substrate with the second holder when transporting the substrate after the exposure processing by the exposure device, the sixth transport unit may comprise third and fourth holders for holding the substrate, and wherein the sixth transport unit may hold the substrate with the third holder when transporting the substrate before the exposure processing by the exposure device and may hold the substrate with the fourth holder when transporting the substrate after the exposure processing by the exposure device.

In this case, the first and third holders are used when transporting the substrate to which no liquid is attached before the exposure processing, while the second and fourth holders are used when transporting the substrate to which a liquid is attached after the exposure processing. This prevents a liquid from attaching to the first and third holders, so as to prevent the attachment of a liquid to the substrate before the exposure processing. This makes it possible to prevent contamination of the substrate due to the attachment of particles and the like in the atmosphere. As a result, it is possible to prevent the generation of processing defects due to, e.g., degradation in the resolution performance in the exposure device.

The second holder may be provided below the first holder, and the fourth holder may be provided below the third holder. This prevents a liquid that drops from the second and fourth holders and substrates held thereon from attaching to the first and third holders and substrates held thereon. This reliably prevents a liquid from attaching to the substrate before the exposure processing.

The fifth processing unit may include an edge exposure unit that subjects a peripheral portion of the substrate to exposure. In this case, the peripheral portion of the substrate is subjected to the exposure processing by the edge exposure unit.

A substrate processing method according to another aspect of the invention for processing a substrate in a substrate processing apparatus that is arranged adjacent to an exposure device, and comprises a first processing unit, a second processing unit, and a third processing unit comprises the steps of forming a photosensitive film made of a photosensitive material on the substrate by the first processing unit before exposure processing by the exposure device, forming a protective film for protecting the photosensitive film on the substrate by the second processing unit before the exposure processing by the exposure device, and applying development processing to the substrate by the third processing unit after the exposure processing by the exposure device.

In the substrate processing method, the photosensitive film is formed on the substrate by the first processing unit, and then the protective film is formed on the photosensitive film by the second processing unit. After this, the substrate is subjected to the exposure processing by the exposure device. After the exposure processing, the substrate is subjected to the development processing by the third processing unit.

In this way, the protective film is formed on the photosensitive film before the exposure processing is performed by the exposure device. This prevents, even if the substrate in contact with a liquid is subjected to the exposure processing by the exposure device, a component of the photosensitive material from being eluted in the liquid. This also reduces contamination in the exposure device while preventing the component of the photosensitive material from remaining on a surface of the substrate. As a result, processing defects in the substrate that may be generated in the exposure device can be reduced.

The substrate processing apparatus may further comprise a fourth processing unit, and the method may further comprise the step of removing the protective film by the fourth processing unit after the exposure processing by the exposure device and before the development processing by the third processing unit. This ensures the removal of the protective film by the fourth processing unit before the substrate is subjected to the development processing by the third processing unit, which allows the development processing to be reliably applied to the substrate.

According to the invention, the protective film is formed on the photosensitive film by the second processing unit before the exposure processing is performed by the exposure device. This prevents, even if the substrate in contact with a liquid is subjected to the exposure processing by the exposure device, a component of the photosensitive material from being eluted in the liquid. This also reduces contamination in the exposure device while preventing the component of the photosensitive material from remaining on a surface of the substrate. As a result, processing defects in the substrate that may be generated in the exposure device can be reduced.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 12 is a schematic plan view of a substrate processing apparatus according to a ninth embodiment of the invention.

DESCRIPTION OF THE PREFERRED EMBODIMENTS

A substrate processing apparatus according to embodiments of the invention will be described below with reference to the drawings. A substrate as used in the specification includes a semiconductor substrate, a substrate for a liquid crystal display, a substrate for a plasma display, a glass substrate for a photomask, a substrate for an optical disk, a substrate for a magnetic disk, a substrate for a magneto-optical disk, and a substrate for a photomask.

(1) First Embodiment

A substrate processing apparatus according to a first embodiment of the invention will be described below with reference to FIG. 1 to FIG. 4.

Each of FIG. 1 to FIG. 4 is accompanied by the arrows that indicate X, Y, and Z directions perpendicular to one another, for clarification of positions. The X and Y directions are perpendicular to each other in a horizontal plane, and the Z direction corresponds to the vertical direction. In each of the directions, the direction toward an arrow is defined as + direction, and the opposite direction is defined as − direction. The rotation direction about the Z direction is defined as θ direction.

Figure 1:
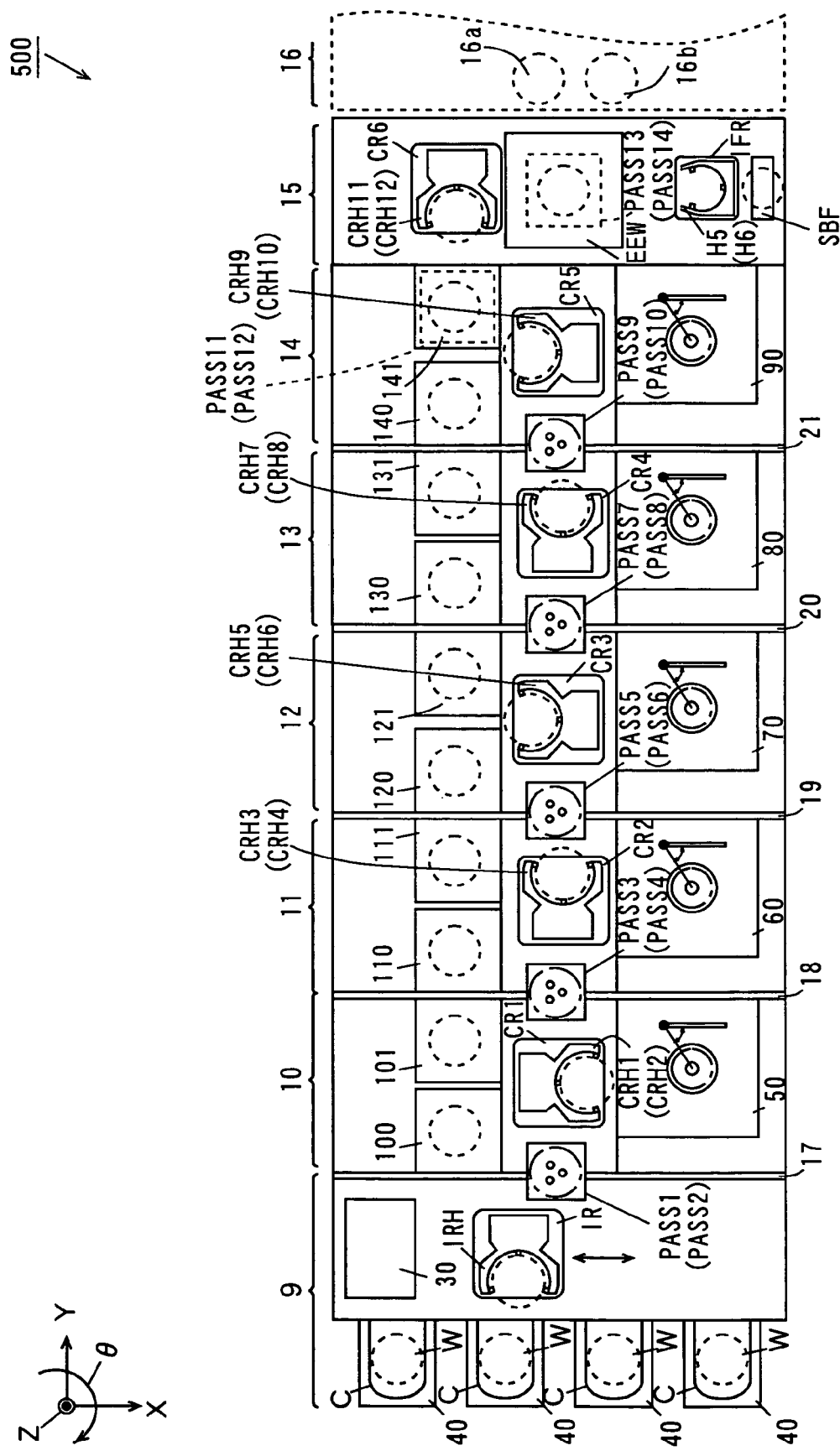
FIG. 1 is a schematic plan view of a substrate processing apparatus according to a first embodiment of the invention.

FIG. 1 is a schematic plan view of the substrate processing apparatus according to the first embodiment of the invention.

As shown in FIG. 1, the substrate processing apparatus 500 includes an indexer block 9, an anti-reflection processing block 10, a resist film processing block 11, a development processing block 12, a resist cover film processing block 13, a resist cover film removal block 14, and an interface block 15. An exposure device 16 is also arranged adjacent to the interface block 15. The exposure device 16 applies exposure processing to substrates W by a liquid immersion method.

Each of the indexer block 9, the anti-reflection film processing block 10, the resist film processing block 11, the development processing block 12, the resist cover film processing block 13, the resist cover film removal block 14, and the interface block 15 will hereinafter be referred to as a processing block.

The indexer block 9 includes a main controller (controller) 30 for controlling the operation of each processing block, a plurality of carrier platforms 40, and an indexer robot IR. The indexer robot IR has a hand IRH for receiving and transferring the substrates W.

The anti-reflection film processing block 10 includes thermal processing groups 100, 101 for anti-reflection film, a coating processing group 50 for anti-reflection film, and a first central robot CR1. The coating processing group 50 is arranged opposite to the thermal processing groups 100, 101 with the first central robot CR1 therebetween. The first central robot CR1 has hands CRH1, CRH2 provided one above the other for receiving and transferring the substrates W.

A partition wall 17 is arranged between the indexer block 9 and the anti-reflection film processing block 10 for shielding an atmosphere. The partition wall 17 has substrate platforms PASS1, PASS2 provided closely one above the other for receiving and transferring the substrates W between the indexer block 9 and the anti-reflection film processing block 10. The upper substrate platform PASS1 is used in transferring the substrates W from the indexer block 9 to the anti-reflection film processing block 10, and the lower substrate platform PASS2 is used in transferring the substrates W from the anti-reflection film processing block 10 to the indexer block 9.

Each of the substrate platforms PASS1, PASS2 has an optical sensor (not shown) for detecting the presence or absence of a substrate W. This enables a determination to be made whether or not a substrate W is on the substrate platform PASS1, PASS2. In addition, each of the substrate platforms PASS1, PASS2 has a plurality of support pins secured thereto. Note that each of substrate platforms PASS3 to PASS14 mentioned below similarly has such an optical sensor and support pins.

The resist film processing block 11 includes thermal processing groups 110, 111 for resist film, a coating processing group 60 for resist film, and a second central robot CR2. The coating processing group 60 is arranged opposite to the thermal processing groups 110, 111 with the second central robot CR2 therebetween. The second central robot CR2 has hands CRH3, CRH4 provided one above the other for receiving and transferring the substrates W.

A partition wall 18 is arranged between the anti-reflection film processing block 10 and the resist film processing block 11 for shielding an atmosphere. The partition wall 18 has substrate platforms PASS3, PASS4 provided closely one above the other for receiving and transferring the substrates W between the anti-reflection film processing block 10 and the resist film processing block 11. The upper substrate platform PASS3 is used in transferring the substrates W from the anti-reflection film processing block 10 to the resist film processing block 11. The lower substrate platform PASS4 is used in transferring the substrates W from the resist film processing block 11 to the anti-reflection film processing block 10.

The development processing block 12 includes thermal processing groups 120, 121 for development, a development processing group 70, and a third central robot CR3. The development processing group 70 is arranged opposite to the thermal processing groups 120, 121 with the third central robot CR3 therebetween. The third central robot CR3 has hands CRH5, CRH6 provided one above the other for receiving and transferring the substrates W.

A partition wall 19 is arranged between the resist film processing block 11 and the development processing block 12 for shielding an atmosphere. The partition wall 19 has substrate platforms PASS5, PASS6 provided closely one above the other for receiving and transferring the substrates W between the resist film processing block 11 and the development processing block 12. The upper substrate platform PASS5 is used in transferring the substrates W from the resist film processing block 11 to the development processing block 12, and the lower substrate platform PASS6 is used in transferring the substrates W from the development processing block 12 to the resist film processing block 11.

The resist cover film processing block 13 includes thermal processing groups 130, 131 for resist cover film, a coating processing group 80 for resist cover film, and a fourth central robot CR4. The coating processing group 80 is arranged opposite to the thermal processing groups 130, 131 with the fourth central robot CR4 therebetween. The fourth central robot CR4 has hands CRH7, CRH8 provided one above the other for receiving and transferring the substrates W.

A partition wall 20 is arranged between the development processing block 12 and the resist cover film processing block 13 for shielding an atmosphere. The partition wall 20 has substrate platforms PASS7, PASS8 provided closely one above the other for receiving and transferring the substrates W between the development processing block 12 and the resist cover film processing block 13. The upper substrate platform PASS7 is used in transferring the substrates W from the development processing block 12 to resist cover film processing block 13, and the lower substrate platform PASS8 is used in transferring the substrates W from the resist cover film processing block 13 to development processing block 12.

The resist cover film removal block 14 includes thermal processing groups 140, 141 for post-exposure bake, a removal processing group 90 for resist cover film, and a fifth central robot CR5. The thermal processing group 141, adjacent to the interface block 15, comprises substrate platforms PASS11, PASS12 as described below. The removal processing group 90 is arranged opposite to the thermal processing groups 140, 141 with the fifth central robot CR5 therebetween. The fifth central robot CR5 has hands CRH9, CRH10 provided one above the other for receiving and transferring the substrates W.

A partition wall 21 is arranged between the resist cover film processing block 13 and the resist cover film removal block 14 for shielding an atmosphere. The partition wall 21 has substrate platforms PASS9, PASS10 provided closely one above the other for receiving and transferring the substrates W between the resist cover film processing block 13 and the resist cover film removal block 14. The upper substrate platform PASS9 is used in transferring the substrates W from the resist cover film processing block 13 to the resist cover film removal block 14, and the lower substrate platform PASS10 is used in transferring the substrates W from the resist cover film removal block 14 to the resist cover film processing block 13.

The interface block 15 includes a sixth central robot CR6, a feed buffer unit SBF, an interface transport mechanism IFR, and edge exposure units EEW. A return buffer unit RBF and substrate platforms PASS13, PASS14 mentioned below are provided under the edge exposure units EEW. The sixth central robot CR6 has hands CRH11, CRH12 provided one above the other for receiving and transferring the substrates W.

In the substrate processing apparatus 500 according to this embodiment, the indexer block 9, the anti-reflection film processing block 10, the resist film processing block 11, the development processing block 12, the resist cover film processing block 13, the resist cover film removal block 14, and the interface block 15 are sequentially arranged in parallel along the Y direction.

Figure 2:
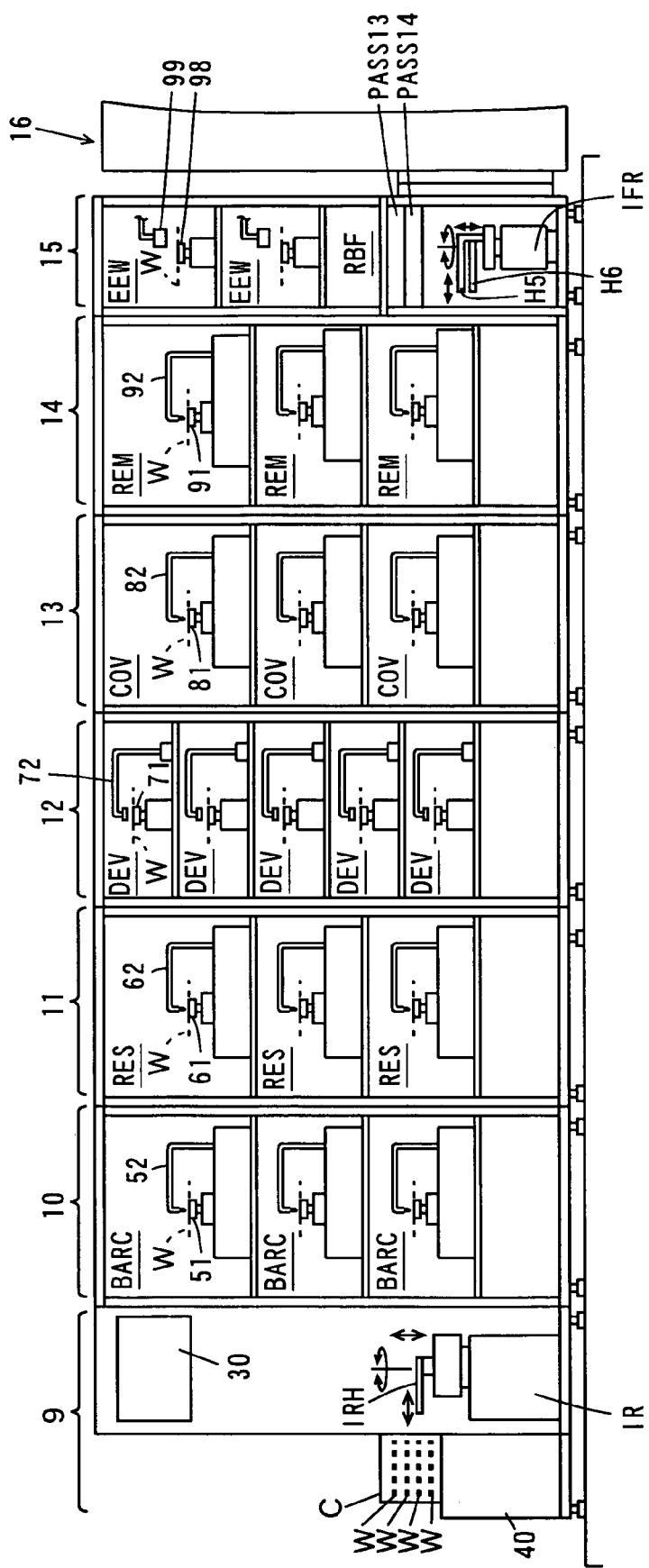
FIG. 2 is a side view of the substrate processing apparatus in FIG. 1 that is seen from the +X direction.

FIG. 2 is a side view of the substrate processing apparatus 500 in FIG. 1 that is seen from the +X direction.

The coating processing group 50 in the anti-reflection film processing block 10 (see FIG. 1) includes a vertical stack of three coating units BARC. Each of the coating units BARC comprises a spin chuck 51 for rotating a substrate W while holding the substrate W in a horizontal attitude by suction, and a supply nozzle 52 for supplying coating liquid for anti-reflection film to the substrate W held on the spin chuck 51.

The coating processing group 60 in the resist film processing block 11 (see FIG. 1) includes a vertical stack of three coating units RES. Each of the coating units RES comprises a spin chuck 61 for rotating a substrate W while holding the substrate W in a horizontal attitude by suction, and a supply nozzle 62 for supplying coating liquid for resist film to the substrate W held on the spin chuck 61.

The development processing group 70 in the development processing block 12 includes a vertical stack of five development processing units DEV. Each of the development processing units DEV comprises a spin chuck 71 for rotating a substrate W while holding the substrate W in a horizontal attitude by suction, and a supply nozzle 72 for supplying development liquid to the substrate W held on the spin chuck 71.

The coating processing group 80 in the resist cover film processing block 13 includes a vertical stack of three coating units COV. Each of the coating units COV comprises a spin chuck 81 for rotating a substrate W while holding the substrate W in a horizontal attitude by suction, and a supply nozzle 82 for supplying coating liquid for resist cover film to the substrate W held on the spin chuck 81. Materials having low affinity with resists and water (i.e., materials having low reactivity with resists and water), such as, for example, fluororesin, may be used as the coating liquid for resist cover film. Each of the coating units COV forms a resist cover film over the resist film formed on a substrate W by applying the coating liquid onto the substrate W while rotating the substrate W.

The removal processing group 90 in the resist cover film removal block 14 includes a vertical stack of three removal units REM. Each of the removal units REM comprises a spin chuck 91 for rotating a substrate W in a horizontal attitude by suction, and a supply nozzle 92 for supplying stripping liquid (e.g., fluororesin) onto the substrate W held on the spin chuck 91. Each of the removal units REM removes the resist cover film formed on a substrate W by applying the stripping liquid onto the substrate W while rotating the substrate W.

Note that the method of removing resist cover films by the removal units REM is not limited to the example shown above. For example, a resist cover film may be removed by supplying stripping liquid onto a substrate W while allowing a slit nozzle to move above the substrate W.

The interface block 15 includes a vertical stack of the two edge exposure units EEW, the return buffer unit RBF, and the substrate platforms PASS13, PASS14 as well as the sixth central robot CR6 (see FIG. 1) and the interface transport mechanism IFR. Each of the edge exposure units EEW comprises a spin chuck 98 for rotating a substrate W in a horizontal attitude by suction, and a light irradiator 99 for subjecting a peripheral portion of the substrate W held on the spin chuck 98 to exposure.

Figure 3:
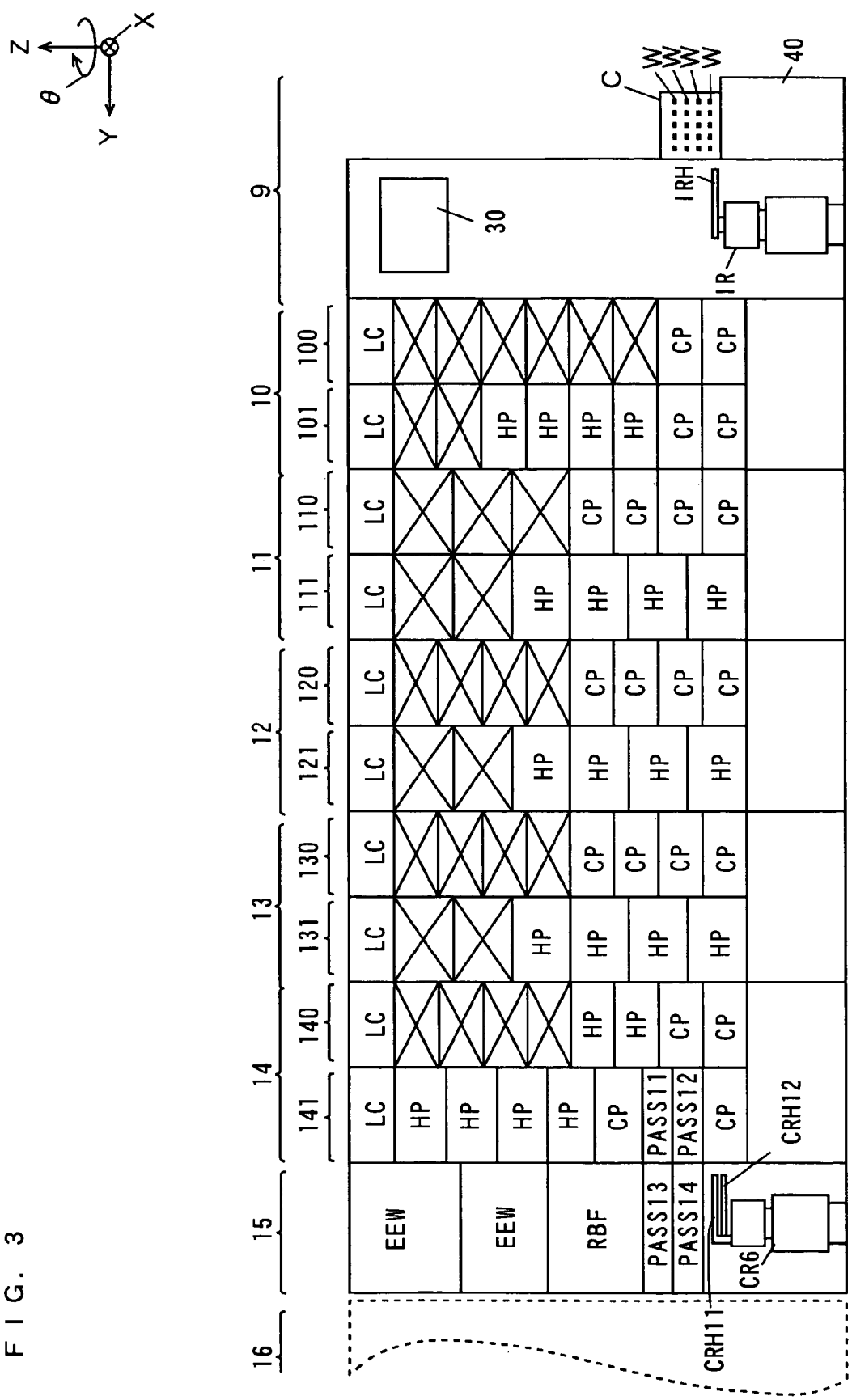
FIG. 3 is a side view of the substrate processing apparatus in FIG. 1 that is seen from the −X direction.

FIG. 3 is a side view of the substrate processing apparatus 500 in FIG. 1 that is seen from the −X direction.

In the anti-reflection film processing block 10, the thermal processing group 100 includes a vertical stack of two cooling units (cooling plates) CP, and the thermal processing group 101 includes a vertical stack of four heating units (hot plates) HP and two cooling units CP. The thermal processing group 100 also includes a local controller LC on top thereof for controlling the temperatures of the cooling units CP, and the thermal processing group 101 also includes a local controller LC on top thereof for controlling the temperatures of the heating units HP and the cooling plates CP.

In the resist film processing block 11, the thermal processing group 110 includes a vertical stack of four cooling units CP, and the thermal processing group 111 includes a vertical stack of four heating units HP. The thermal processing group 110 also includes a local controller LC on top thereof for controlling the temperatures of the cooling units CP, and the thermal processing group 111 also includes a local controller LC on top thereof for controlling the temperatures of the heating units HP.

In the development processing block 12, the thermal processing group 120 includes a vertical stack of four cooling units CP, and the thermal processing group 121 includes a vertical stack of four heating units HP. The thermal processing group 120 also includes a local controller LC on top thereof for controlling the temperatures of the cooling units CP, and the thermal processing group 121 includes a local controller LC on top thereof for controlling the temperatures of the heating units HP.

In the resist cover film processing block 13, the thermal processing group 130 includes a vertical stack of four cooling units CP, and the thermal processing group 131 includes a vertical stack of four heating units HP. The thermal processing group 130 also includes a local controller LC on top thereof for controlling the temperatures of the cooing units CP, and the thermal processing group 131 also includes a local controller LC on top thereof for controlling the temperatures of the heating units HP.

In the resist cover film removal block 14, the thermal processing group 140 includes a vertical stack of two heating units HP and two cooling units CP, and the thermal processing group 141 includes a vertical stack of four heating units HP, a cooling unit CP, substrate platforms PASS1, PASS12, and a cooling unit CP. The thermal processing group 140 also includes a local controller LC on top thereof for controlling the temperatures of the heating units HP and the cooling plates CP, and the thermal processing group 141 also includes a local controller LC on top thereof for controlling the temperatures of the heating units HP and the cooling units CP.

Next, the operation of the substrate processing apparatus 500 in this embodiment will be described.

Carriers C for storing the substrates W in multiple stages are mounted on the carrier platforms 40, respectively, in the indexer block 9. The indexer robot IR takes out a substrate W yet to be processed which is stored in a carrier C using the hand IRH. Then, the indexer robot IR moves in the ±X direction while rotating in the ±θ direction to transfer the unprocessed substrate W onto the substrate platform PASS1.

Although FOUPs (Front Opening Unified Pods) are adopted as the carriers C in this embodiment, SMIF (Standard Mechanical Inter Face) pods or OCs (Open Cassettes) that expose stored substrates W to outside air may also be used, for example. In addition, although linear-type transport robots that move their hands forward or backward by sliding them linearly to a substrate W are used as the indexer robot IR, the first central robot CR1 to the sixth central robot CR6, and the interface transport mechanism IFR, multi-joint type transport robots that linearly move their hands forward and backward by moving their joints may also be used.

The unprocessed substrate W that has been transferred onto the substrate platform PASS1 is received by the hand CRH1 of the first central robot CR1 in the anti-reflection film processing block 10. The first central robot CR1 carries the substrate W into the thermal processing group 100 or 101 with the hand CRH1. After this, the first central robot CR1 takes out the thermally treated substrate W from the thermal processing group 100 or 101 with the hand CRH2, and then carries the substrate W into the coating processing group 50. The coating processing group 50 forms a coating of an anti-reflection film on a substrate W using a coating unit BARC, in order to reduce potential standing waves and halation generated during exposure.

The first central robot CR1 subsequently takes out the substrate W after the coating processing from the coating processing group 50 with the hand CRH1, and carries the substrate W into the thermal processing group 100 or 101.

Then, the first central robot CR1 takes out the thermally treated substrate W from the thermal processing group 100 or 101 with the hand CRH2, and transfers the substrate W onto the substrate platform PASS3.

The substrate W on the substrate platform PASS3 is received by the hand CRH3 of the second central robot CR2 in the resist film processing block 11. The second central robot CR2 carries the substrate W into the thermal processing group 110 or 111 with the hand CRH3. The second central robot CR2 then takes out the thermally treated substrate W from the thermal processing group 110 or 111 with the hand CRH4, and carries the substrate W into the coating processing group 60. In the coating processing group 60, a coating unit RES forms a coating of a resist film over the substrate W that is coated with the anti-reflection film.

After this, the second central robot CR2 takes out the substrate W after the coating processing from the coating processing group 60 with the hand CRH3, and carries the substrate into the thermal processing group 110 or 111.

Then, the second central robot CR2 takes out the thermally treated substrate W from the thermal processing group 110 or 111 with the hand CRH4, and transfers the substrate W onto the substrate platform PASS5.

The substrate W on the substrate platform PASS5 is received by the hand CRH5 of the third central robot CR3 in the development processing block 12. The third central robot CR3 transfers the substrate W onto the substrate platform PASS7 with the hand CRH5.

The substrate W on the substrate platform PASS7 is received by the hand CRH7 of the fourth central robot CR4 in the interface block 15. The fourth central robot CR4 carries the substrate W into the coating processing group 80 with the hand CRH7. In the coating processing group 80, a coating unit COV forms a coating of a resist cover film on the substrate W that is coated with the resist film.

Then, the fourth central robot CR4 takes out the substrate W after the coating processing from the coating processing group 80 with the hand CRH8, and carries the substrate into the thermal processing group 130 or 131.

Next, the fourth central robot CR4 takes out the substrate W after the thermal processing from the thermal processing group 130, 131 with the hand CRH7, and transfers the substrate W onto the substrate platform PASS9.

The substrate W on the substrate platform PASS9 is received by the hand CRH9 of the fifth central robot CR5 in the resist cover film removal block 14. The fifth central robot CR5 transfers the substrate W onto the substrate platform PASS11 with the hand CRH9.

The substrate W on the substrate platform PASS11 is received by the hand CRH11 of the sixth central robot CR6 in the interface block 15. The sixth central robot CR6 carries the substrate W into an edge exposure unit EEW with the hand CRH11. The edge exposure unit EEW subjects the peripheral portion of the substrate W to exposure processing.

The sixth central robot CR6 then takes out the substrate W after the edge exposure processing from the edge exposure unit EEW with the hand CRH11. The sixth central robot CR6 subsequently transfers the substrate W onto the substrate platform PASS13 with the hand CRH11.

The substrate W on the substrate platform PASS13 is carried into the exposure device 16 by the hand H5 of the interface transport mechanism IFR. The substrate is subjected to exposure processing by the exposure device 16, and then transferred onto the PASS14 by the interface transport mechanism IFR with the hand H6. The interface transport mechanism IFR will be described in detail below.

The substrate W on the substrate platform PASS14 is received by the hand CRH12 of the sixth central robot CR6 in the interface block 15. The sixth central robot CR6 carries the substrate W into the thermal processing group 141 in the resist cover film removal block 14 with the hand CRH12. The substrate W is subjected to a post-exposure bake (PEB) by the thermal processing group 141. Then, the sixth central robot CR6 takes out the substrate W from the thermal processing group 141 with the hand CRH12, and transfers the substrate W onto the substrate platform PASS12.

Although the post-exposure bake is performed by the thermal processing group 141 in this embodiment, it may also be performed by the thermal processing group 140.

The substrate W on the substrate platform PASS12 is received by the hand CRH10 of the fifth central robot CR5 in the resist cover film removal block 14. The fifth central robot CR5 carries the substrate W into the removal processing group 90 with the hand CRH10. The removal processing group 90 removes the resist cover film.

After this, the fifth central robot CR5 takes out the processed substrate W from the removal processing group 90 with the hand CRH10, and transfers the substrate W onto the substrate platform PASS10.

If the removal processing group 90 is temporarily not capable of applying the processing for removing the resist cover film by, e.g., a failure, the substrate W may temporarily be stored in the return buffer RBF in the interface block 15 after the thermal treatment in the thermal processing group 141.

The substrate W on the substrate platform PASS10 is transferred onto the substrate platform PASS8 by the hand CRH8 of the fourth central robot CR4 in the resist cover film processing block 13.

The substrate W on the substrate platform PASS8 is received by the hand CRH6 of the third central robot CR3 in the development processing block 12. The third central robot CR3 carries the substrate W into the development processing group 70 with the hand CRH6. The exposed substrate W is subjected to development processing by the development processing group 70.

After this, the third central robot CR3 takes out the substrate W after the development processing from the development processing group with the hand CRH5, and carries the substrate W into the thermal processing group 120 or 121.

Next, the third central robot CR3 takes out the thermally treated substrate W from the thermal processing group 120 or 121 with the hand CRH6, and transfers the substrate W onto the substrate platform PASS6.

The substrate W on the substrate platform PASS6 is transferred onto the substrate platform PASS4 by the hand CRH4 of the second central robot CR2 in the resist film processing block 11. The substrate W on the substrate platform PASS4 is transferred onto the substrate platform PASS2 by the hand CRH2 of the first central robot CR1 in the anti-reflection film processing block 10.

The substrate W on the substrate platform PASS2 is stored in a carrier C by the indexer robot IR in the indexer block 9. Each of the processings to the substrate W in the substrate processing apparatus 500 is thus completed.

As described above, in the substrate processing apparatus 500 according to this embodiment, a resist cover film is formed over a resist film formed on a substrate W in the resist cover film processing block 13 before the substrate W is subjected to exposure processing by the exposure device 16. Even if the substrate W contacts a liquid in the exposure device 16 in this case, the resist cover film prevents the contact of the resist film with the liquid, so as to prevent a component of the resist from being eluted in the liquid. This reduces contamination of a lens (not shown) and the like of the exposure device 16 while preventing the component of the resist from remaining on a surface of the substrate W. This results in reduced processing defects in substrates W that may be generated in the exposure device 16.

Moreover, the resist cover film is removed in the resist cover film removal block 14 before the substrate W is subjected to development processing in the development processing block 12. This ensures the removal of the resist cover film before the development processing, allowing the development processing to be reliably applied to the substrate W.

When using a liquid capable of removing resist cover films as the development liquid in the development processing units DEV in the development processing block 12, the resist cover film removal block 14 may be omitted. This results in a smaller substrate processing apparatus 500.

Figure 4:
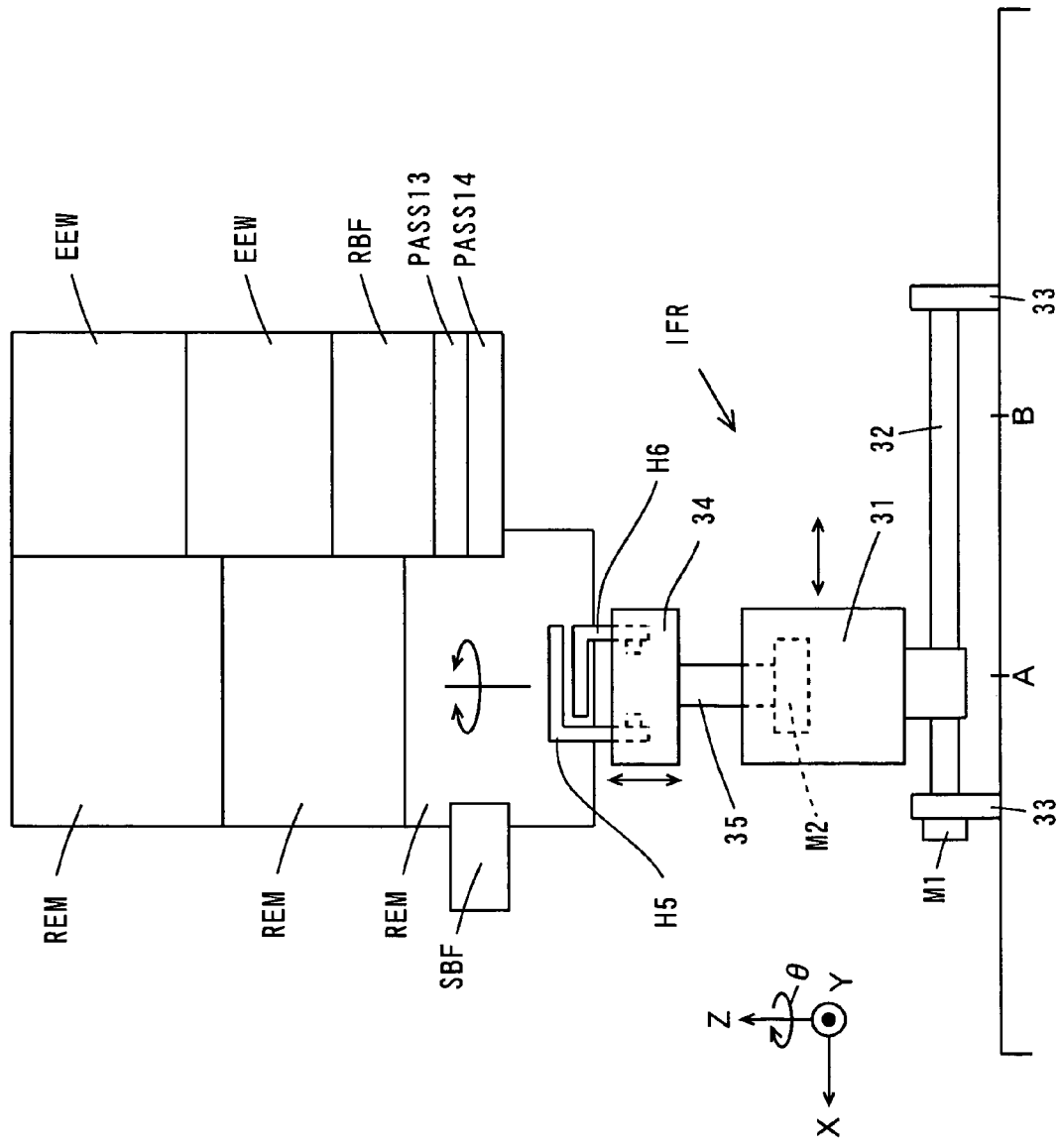
FIG. 4 is a diagram for use in illustrating the configuration and the operation of the interface transport mechanism.

The interface transport mechanism IFR is next described. FIG. 4 is a diagram for illustrating the configuration and the operation of the interface transport mechanism IFR.

The configuration of the interface transport mechanism IFR is first described. As shown in FIG. 4, a movable base 31 of the interface transport mechanism IFR is threadably mounted to a screwed shaft 32. The screwed shaft 32 is rotatively supported with support bases 33 so as to extend in the X direction. One end of the screwed shaft 32 is provided with a motor M1, which causes the screwed shaft 32 to rotate and the movable base 31 to move horizontally in the ±X direction.

A hand support base 34 is mounted to the movable base 31 so as to rotate in the ±θ direction while moving up and down in the ±Z direction. The hand support base 34 is coupled to a motor M2 through a rotation shaft 35 in the movable base 31, and rotated by this motor M2. Two hands H5, H6 for holding the substrate W in a horizontal attitude are mounted to the hand support base 34 one above the other so as to move forward and backward.

The operation of the interface transport mechanism IFR is next described. The operation of the interface transport mechanism IFR is controlled by the main controller 30 in FIG. 1.

The interface transport mechanism IFR first rotates the hand support base 34 at the position A in FIG. 4 while lifting the hand support base 34 in the +Z direction, to allow the hand H5 to enter the substrate platform PASS13. When the hand H5 has received the substrate W at the substrate platform PASS13, the interface transport mechanism IFR retracts the hand H5 from the substrate platform PASS13, and lowers the hand support base 34 in the −Z direction.

Next, the interface transport mechanism IFR moves in the −X direction, and rotates the hand support base 34 at the position B while allowing the hand H5 to enter a substrate inlet 16a of the exposure device 16 (see FIG. 1). After carrying the substrate W into the substrate inlet 16a, the interface transport mechanism IFR retracts the hand H5 from the substrate inlet 16a.

Then, the substrate transport mechanism IFR allows the hand H6 to enter a substrate outlet 16b of the exposure device 16 (see FIG. 1). When the hand H6 has received the substrate W after exposure processing at the substrate outlet 16b, the interface transport mechanism IFR retracts the hand H6 from the substrate outlet 16b.

After this, the interface transport mechanism IFR moves in the +X direction, and rotates the hand support base 34 at the position A while lifting the hand support base 34 in the +Z direction, to allow the hand H6 to enter the substrate platform PASS14, and transfers the substrate W thereon.

If the exposure device 16 is not capable of receiving the substrate W during the transport of the substrate W from the substrate platform PASS13 to the exposure device 16, the substrate W is temporarily stored in the feed buffer unit SBF.

As describe above, in this embodiment, the interface transport mechanism IFR employs the hand H5 when transporting the substrate W from the substrate platform PASS13 to the exposure device 16, and employs the hand H5 when transporting the substrate W from the exposure device 16 to the substrate platform PASS14. That is, the hand H6 is used for transporting the substrate W to which a liquid is attached immediately after the exposure processing, while the hand H5 is used for transporting the substrate W to which no liquid is attached before the exposure processing. This prevents the liquid on the substrate W from attaching to the hand H5.

Moreover, the hand H6 is arranged below the hand H5, so that even if a liquid drops from the hand H6 and the substrate W held thereon, the liquid will not attach to the hand H5 and the substrate W held thereon.

Furthermore, as described above, the sixth central robot CR6 also employs the lower hand CRH12 when transporting the substrate W to which a liquid is attached after the exposure processing (between the substrate platform PASS14 and the thermal processing group 141), and employs the upper hand CRH11 when transporting the substrate W to which no liquid is attached before the exposure processing (between the substrate platform PASS11 and the edge exposure units EEW, and between the edge exposure units EEW and the substrate platform PASS13). This prevents a liquid from attaching to the substrate W before the exposure processing also in the sixth central robot CR6.

As a result of the foregoing, a liquid is prevented from attaching to the substrate W before the exposure processing, so as to prevent contamination of the substrate W due to the attachment of particles and the like in the atmosphere. This prevents the generation of processing defects in the exposure device 16 due to degradation in the resolution performance and the like.

Although the single interface transport mechanism IFR is used for transporting the substrates W in this embodiment, a plurality of interface transport mechanisms IFR may be used for transporting the substrates W.

Moreover, the operation and the configuration of the interface transport mechanism IFR may be modified according to the positions of the substrate inlet 16a and the substrate outlet 16b of the exposure device 16. For example, where the substrate inlet 16a and the substrate outlet 16b of the exposure device 16 are arranged opposite to the position A in FIG. 4, the screwed shaft 32 in FIG. 4 may be omitted.

Furthermore, the numbers of the coating units BARC, RES, COV, the development processing units DEV, the removal units REM, the heating units HP, and the cooling units CP may suitably be changed according to the processing speed of each processing block.

In this embodiment, the anti-reflection film processing block 10, the resist film processing block 11, the development processing block 12, the resist cover film processing block 13, and the resist cover film removal block 14 correspond to a processing section; the interface block 15 corresponds to an interface; the coating units RES correspond to a first processing unit; resist film processing block 11 corresponds to a first processing block; the coating units COV correspond to a second processing unit; the resist cover film processing block 13 corresponds to a second processing block; the development processing units DEV correspond to a third processing unit; the development processing block 12 corresponds to a third processing block; the removal units REM correspond to a fourth processing unit; the resist cover film removal block 14 corresponds to a fourth processing block; the resist film corresponds to a photosensitive film; and the resist cover film corresponds to a protective film.

The heating units HP and the cooling units CP correspond to first to third thermal processing units; the second central robot CR2 corresponds to a first transport unit; the fourth central robot CR4 corresponds to a second transport unit; the third central robot CR3 corresponds to a third transport unit; the fifth central robot CR5 corresponds to a fourth transport unit; the sixth central robot CR6 corresponds to a fifth transport unit; the interface transport mechanism IFR corresponds to a sixth transport unit; the hand CRH 11 corresponds to a first holder; the hand CRH12 corresponds to a second holder; the hand H5 corresponds to a third holder; the hand H6 corresponds to a fourth holder; and the substrate platforms PASS13, 14 correspond to a platform.

Other Embodiments

Second to tenth embodiments will be described below. Description of the operation and the processing performed in each of the processing blocks is omitted as it is already provided in the first embodiment. In addition, the numbers of the coating units BARC, RES, COV, the development processing units DEV, the removal units REM, the heating units HP, and the cooling units CP may suitably be changed according to the processing speed of each processing block. The substrate platforms PASS11, PASS12 are provided in a processing block adjacent to the interface block 15. A post-exposure bake (PEB) is performed by a thermal processing group in the processing block adjacent to the interface block 15.

Second Embodiment

Figure 5:
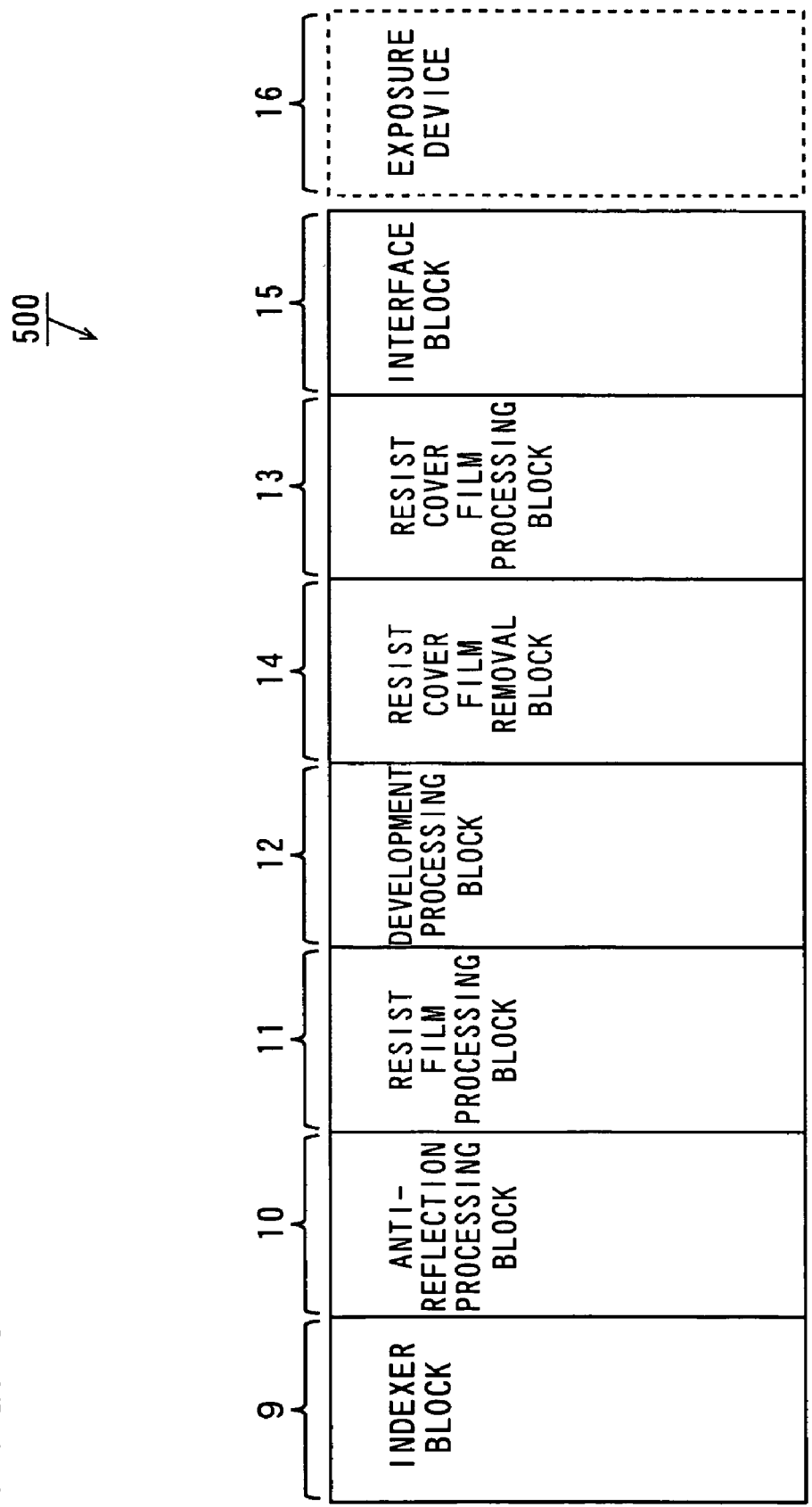
FIG. 5 is a schematic plan view of a substrate processing apparatus according to a second embodiment of the invention.

FIG. 5 is a schematic plan view of a substrate processing apparatus according to the second embodiment of the invention.

As shown in FIG. 5, in the substrate processing apparatus according to the second embodiment, the indexer block 9, the anti-reflection film processing block 10, the resist film processing block 11, the development processing block 12, the resist cover film removal block 14, the resist cover film processing block 13, and the interface block 15 are sequentially arranged in parallel. In addition, an exposure device 16 is arranged adjacent to the interface block 15.

In this embodiment, a substrate that has been carried into the indexer block 9 is transported to the anti-reflection film processing block 10. The substrate W is subjected to given processing in the anti-reflection film processing block 10, and then transported to the resist film processing block 11.

The substrate W is subjected to given processing in the resist film processing block 11, and then transported to the resist cover film processing block 13 by way of the development processing block 12 and the resist cover film removal block 14. The substrate W is subjected to given processing in the resist cover film processing block 13, and then transported to the interface block 15.

The substrate W is subjected to given processing in the interface block 15, and then transported to the exposure device 16. The substrate W is subjected to given processing by the exposure device 16, and then transported to the resist cover film processing block 13 by way of the interface block 15. The substrate W is subjected to a post-exposure bake (PEB) in the resist cover film processing block 13, and then transported to the resist cover film removal block 14.

The substrate W is subjected to given processing in the resist cover film removal block 14, and then transported to the development processing block 12. The substrate W is subjected to given processing in the development processing block 12, and then transported to the indexer block 9 by way of the resist film processing block 11 and the anti-reflection film processing block 10. Each of the processings to the substrate W in the substrate processing apparatus 500 is thus completed.

Third Embodiment

Figure 6:
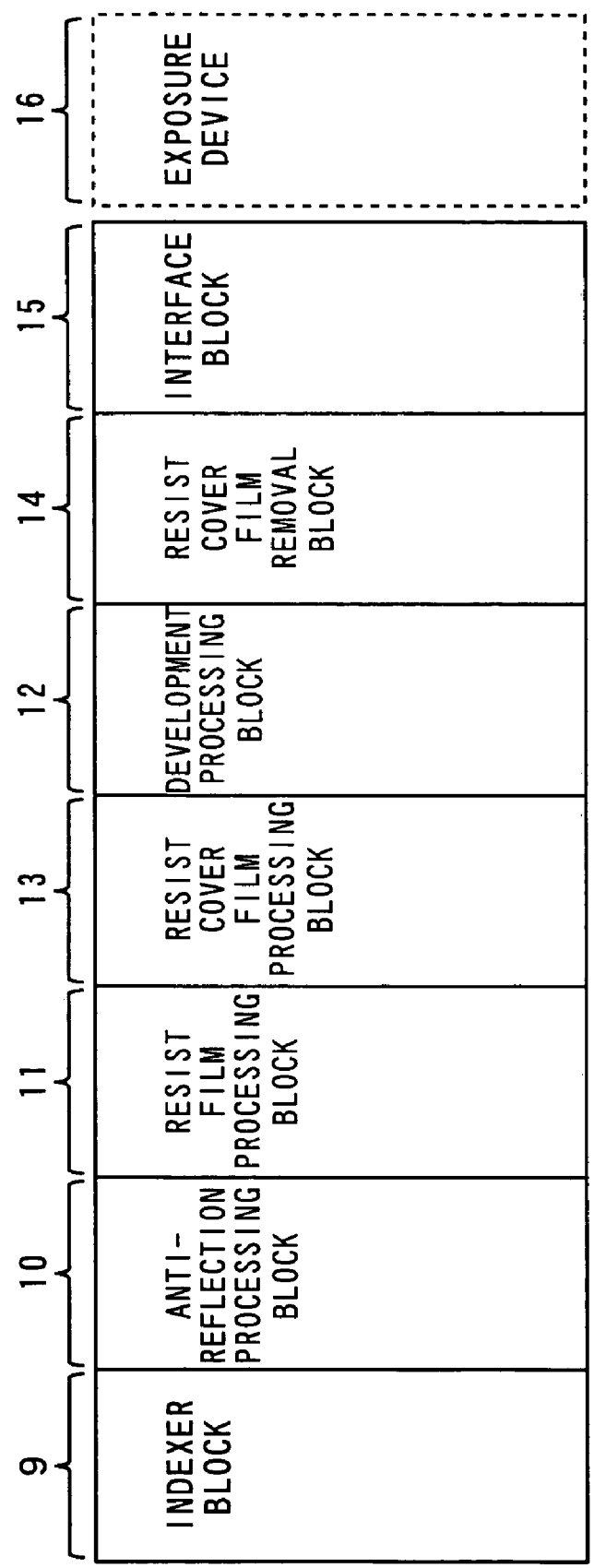
FIG. 6 is a schematic plan view of a substrate processing apparatus according to a third embodiment of the invention.

FIG. 6 is a schematic plan view of a substrate processing apparatus according to the third embodiment of the invention.

As shown in FIG. 6, in the substrate processing apparatus according to the third embodiment, the indexer block 9, the anti-reflection film processing block 10, the resist film processing block 11, the resist cover film processing block 13, the development processing block 12, the resist cover film removal block 14 and the interface block 15 are sequentially arranged in parallel. The exposure device 16 is also arranged adjacent to the interface block 15.

In this embodiment, a substrate W that has been carried into the indexer block 9 is transported to the anti-reflection film processing block 10. The substrate W is subjected to given processing in the anti-reflection film processing block 10, and then transported to the resist film processing block 11.

The substrate W is subjected to given processing in the resist film processing block 11, and then transported to the resist cover film processing block 13. The substrate W is subjected to given processing in the resist cover film processing block 13, and then transported to the interface block 15 by way of the development processing block 12 and the resist cover film removal block 14.

The substrate W is subjected to given processing in the interface block 15, and then transported to the exposure device 16. The substrate W is subjected to given processing by the exposure device 16, and then transported to the resist cover film removal block 14 by way of the interface block 15. The substrate W is subjected to given processing including PEB in the resist cover film removal block 14, and then transported to the development processing block 12.

The substrate W is subjected to given processing in the development processing block 12, and then transported to the indexer block 9 by way of the resist cover film processing block 13, resist film processing block 11, and anti-reflection film processing block 10. Each of the processings to the substrate W in the substrate processing apparatus 500 is thus completed.

Fourth Embodiment

Figure 7:
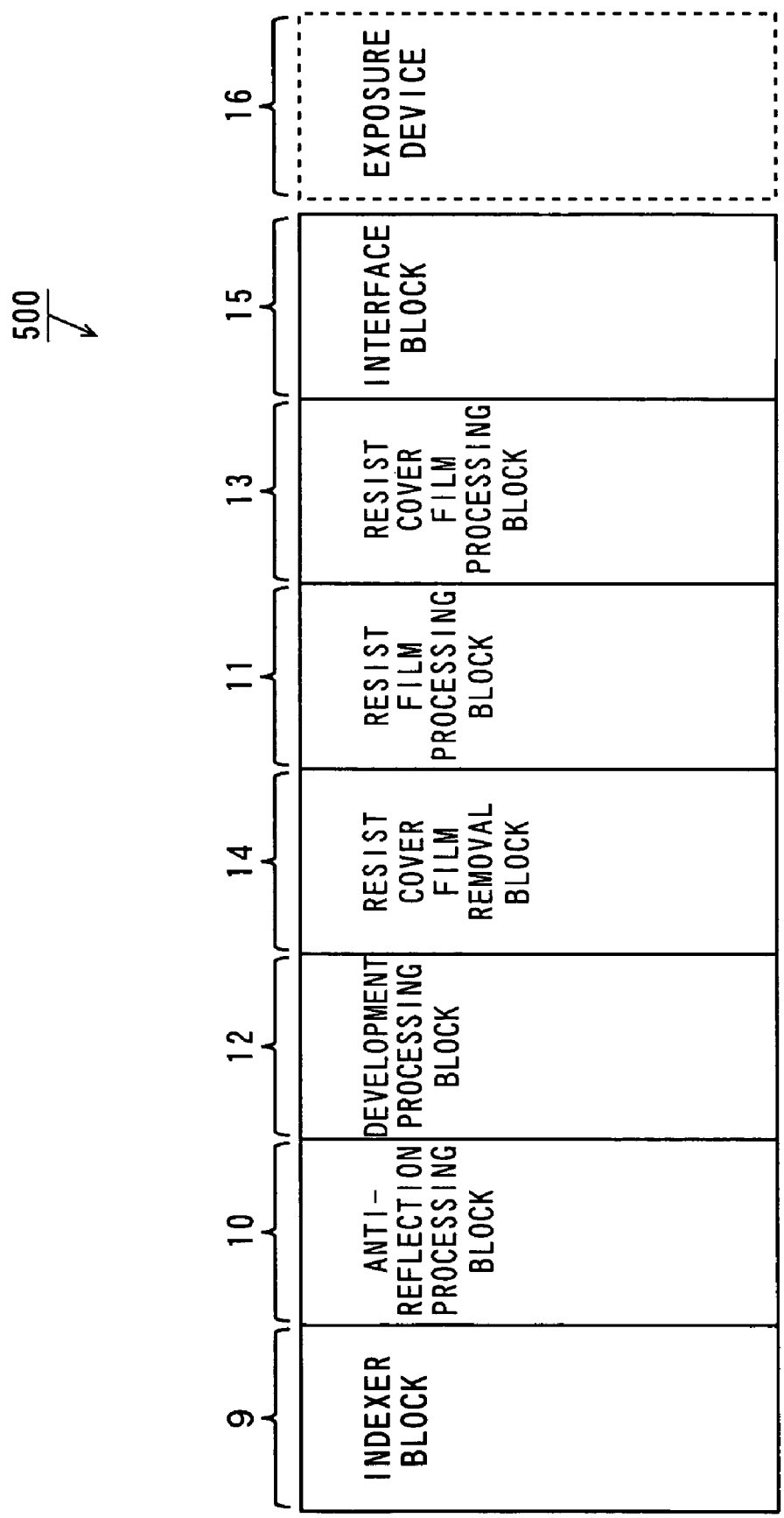
FIG. 7 is a schematic plan view of a substrate processing apparatus according to a fourth embodiment of the invention.

FIG. 7 is a schematic plan view of a substrate processing apparatus according to the fourth embodiment of the invention.

As shown in FIG. 7, in the substrate processing apparatus according to the fourth embodiment, the indexer block 9, the anti-reflection film processing block 10, the development processing block 12, the resist cover film removal block 14, the resist film processing block 11, the resist cover film processing block 13, and the interface block 15 are sequentially arranged in parallel. In addition, an exposure device 16 is arranged adjacent to the interface block 15.

In this embodiment, a substrate W that has been carried into the indexer block 9 is transported to the anti-reflection film processing block 10. The substrate W is subjected to given processing in the anti-reflection film processing block 10, and then transported to the resist film processing block 11 by way of the development processing block 12 and the resist cover film removal block 14.

The substrate W is subjected to given processing in the resist film processing block 11, and then transported to the resist cover film processing block 13. The substrate W is subjected to given processing in the resist cover film processing block 13, and then transported to the interface block 15.

The substrate W is subjected to given processing in the interface block 15, and then transported to the exposure device 16. The substrate W is subjected to given processing by the exposure device 16, and then transported to the resist cover film processing block 13 by way of the interface block 15.

The substrate W is subjected to a post-exposure bake in the resist cover film processing block 13, and then transported to the resist cover film removal block 14 by way of the resist film processing block 11. The substrate W is subjected to given processing in the resist cover film removal block 14, and then transported to the development processing block 12.

The substrate W is subjected to given processing in the development processing block 12, and then transported to the indexer block 9 by way of the anti-reflection film processing block 10. Each of the processings to the substrate W in the substrate processing apparatus 500 is thus completed.

Fifth Embodiment

Figure 8:
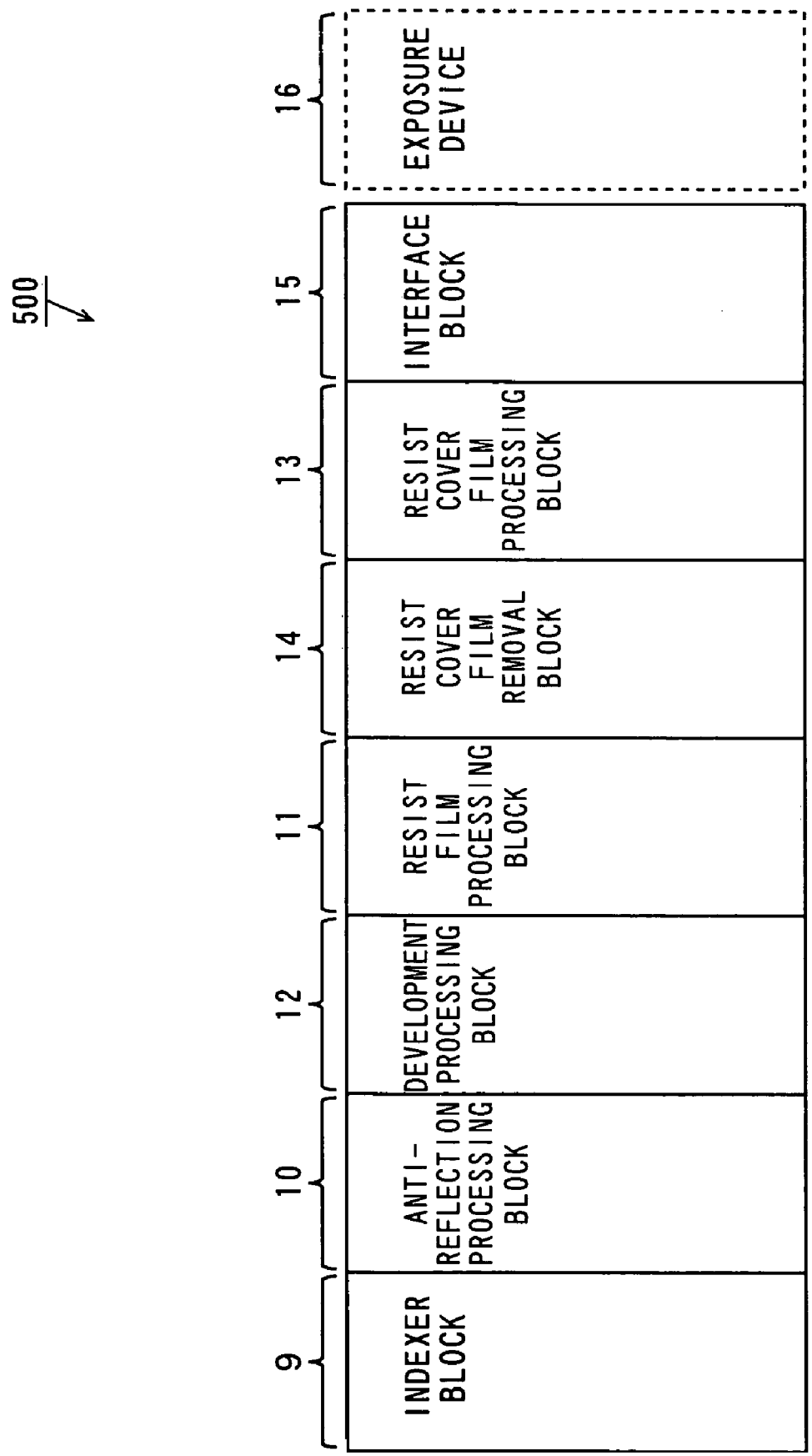
FIG. 8 is a schematic plan view of a substrate processing apparatus according to a fifth embodiment of the invention.

FIG. 8 is a schematic plan view of a substrate processing apparatus according to the fifth embodiment of the invention.

As shown in FIG. 8, in the substrate processing apparatus according to the fifth embodiment, the indexer block 9, the anti-reflection film processing block 10, the development processing block 12, the resist film processing block 11, the resist cover film removal block 14, the resist cover film processing block 13, and the interface block 15 are sequentially arranged in parallel. In addition, an exposure device 16 is arranged adjacent to the interface block 15.

In this embodiment, a substrate W that has been carried into the indexer block 9 is transported to the anti-reflection film processing block 10. The substrate W is subjected to given processing in the anti-reflection film processing block 10, and then transported to the resist film processing block 11 by way of the development processing block 12.

The substrate W is subjected to given processing in the resist film processing block 11, and then transported to the resist cover film processing block 13 by way of the resist cover film removal block 14. The substrate W is subjected to given processing in the resist cover film processing block 13, and then transported to the interface block 15.

The substrate W is subjected to given processing in the interface block 15, and then transported to the exposure device 16. The substrate W is subjected to given processing by the exposure device 16, and then transported to the resist cover film processing block 13 by way of the interface block 15.

The substrate W is subjected to a post-exposure bake in the resist cover film processing block 13, and then transported to the resist cover film removal block 14. The substrate W is subjected to given processing in the resist cover film removal block 14, and then transported to the development processing block 12 by way of the resist film processing block 11.

The substrate W is subjected to given processing in the development processing block 12, and then transported to the indexer block 9 by way of the anti-reflection film processing block 10. Each of the processings to the substrate W in the substrate processing apparatus 500 is thus completed.

Sixth Embodiment

Figure 9:
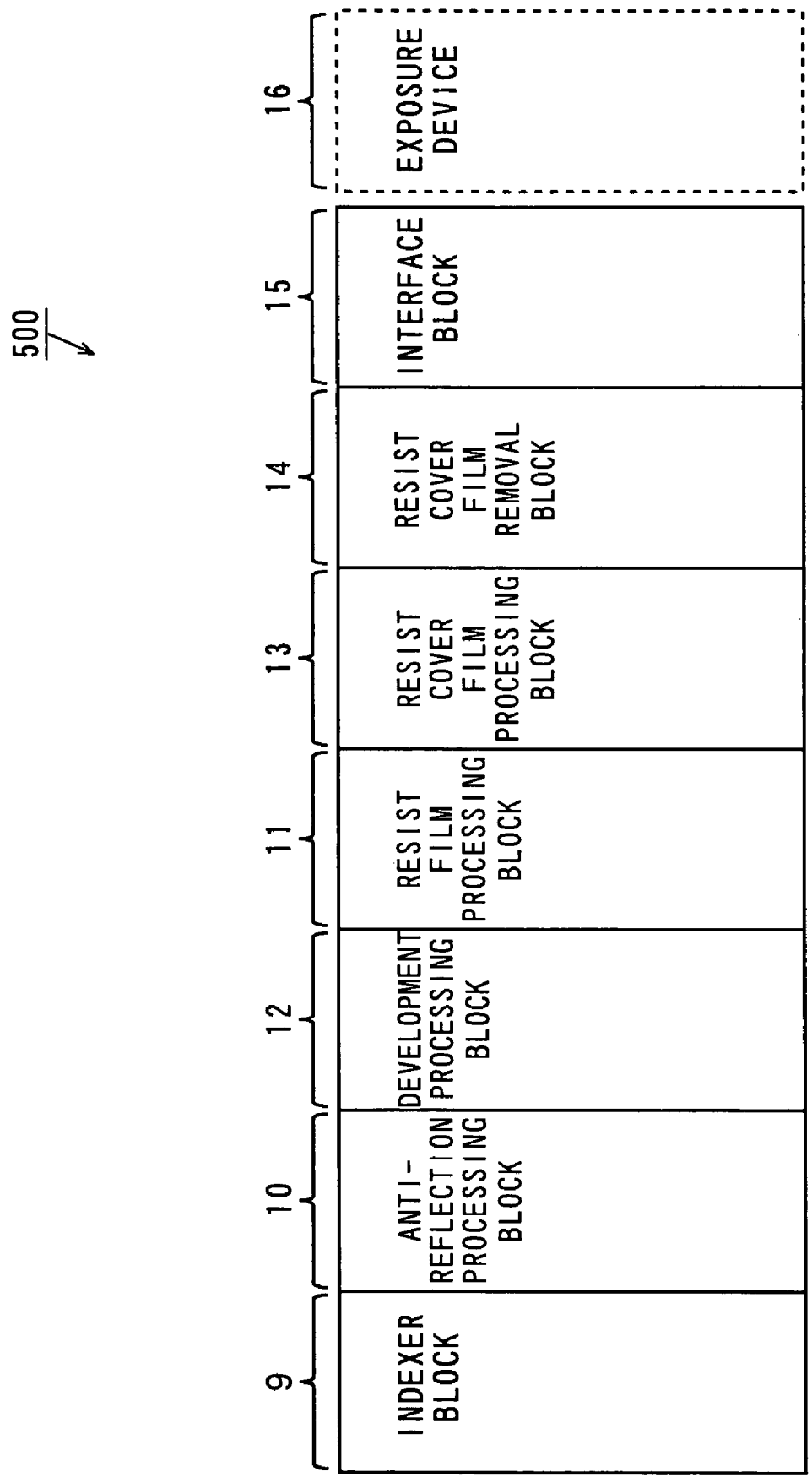
FIG. 9 is a schematic plan view of a substrate processing apparatus according to a sixth embodiment of the invention.

FIG. 9 is a schematic plan view of a substrate processing apparatus according to the sixth embodiment of the invention.

As shown in FIG. 9, in the substrate processing apparatus according to the sixth embodiment, the indexer block 9, the anti-reflection film processing block 10, the development processing block 12, the resist film processing block 11, the resist cover film processing block 13, the resist cover film removal block 14, and the interface block 15 are sequentially arranged in parallel. In addition, an exposure device 16 is arranged adjacent to the interface block 15.

In this embodiment, a substrate W that has been carried into the indexer block 9 is transported to the anti-reflection film processing block 10. The substrate W is subjected to given processing in the anti-reflection film processing block 10, and then transported to the resist film processing block 11 by way of the development processing block 12.

The substrate W is subjected to given processing in the resist film processing block 11, and then transported to the resist cover film processing block 13. The substrate W is subjected to given processing in the resist cover film processing block 13, and then transported to the interface block 15 by way of the resist cover film removal block 14.

The substrate W is subjected to given processing in the interface block 15, and then transported to the exposure device 16. The substrate W is subjected to given processing in the exposure device 16, and then transported to the resist cover film removal block 14 by way of the interface block 15.

The substrate W is subjected to given processing including PEB in the resist cover film removal block 14, and then transported to the development processing block 12 by way of the resist cover film processing block 13 and the resist film processing block 11.

The substrate W is subjected to given processing in the development processing block 12, and then transported to the indexer block 9 by way of the anti-reflection film processing block 10. Each of the processings to the substrate W in the substrate processing apparatus 500 is thus completed.

Seventh Embodiment

Figure 10:
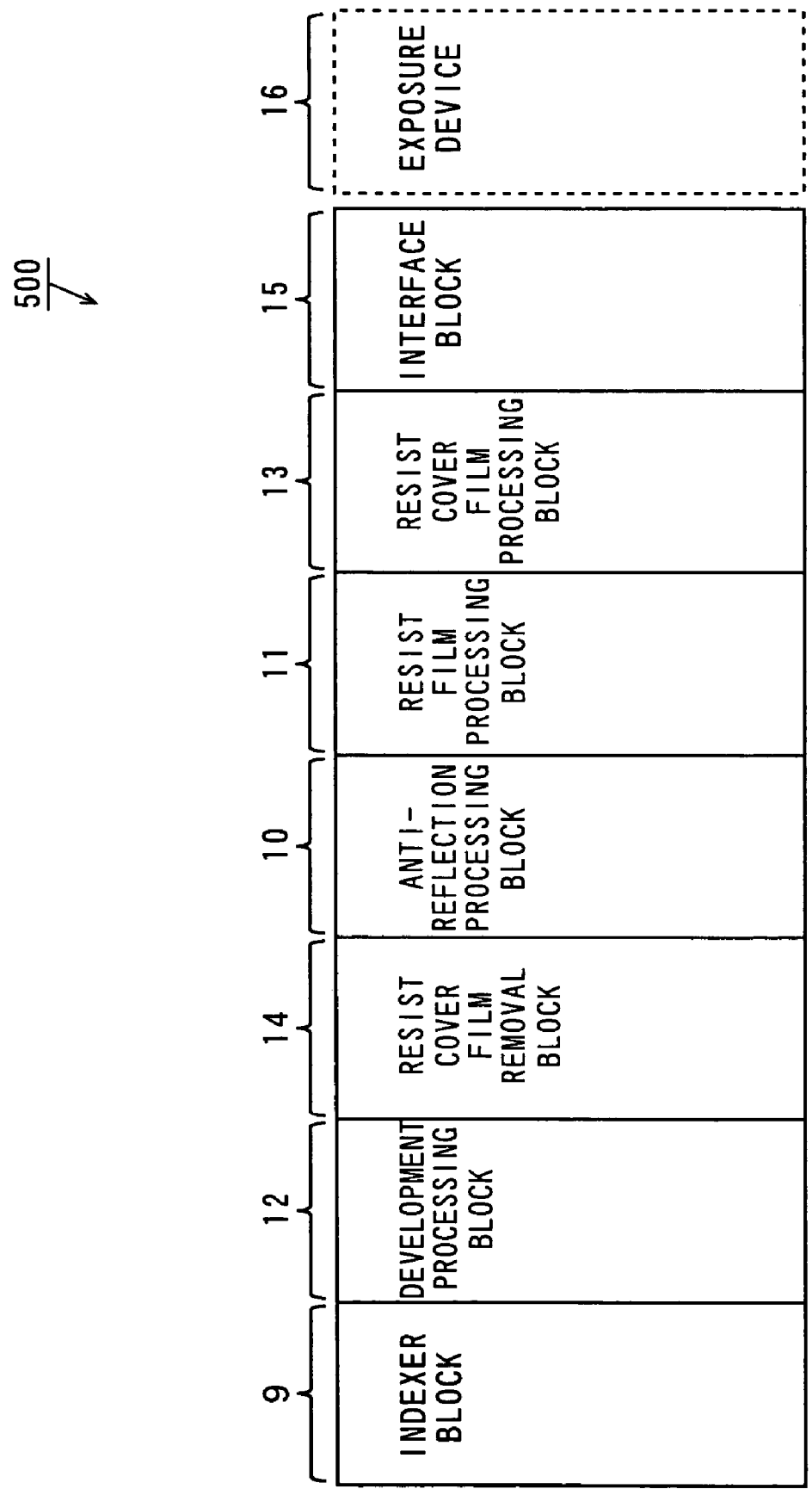
FIG. 10 a schematic plan view of a substrate processing apparatus according to a seventh embodiment of the invention.

FIG. 10 is a schematic plan view of a substrate processing apparatus according to the seventh embodiment of the invention.

As shown in FIG. 10, in the substrate processing apparatus according to the seventh embodiment, the indexer block 9, the development processing block 12 the resist cover film removal block 14, the anti-reflection film processing block 10, the resist film processing block 11, the resist cover film processing block 13, and the interface block 15 are sequentially arranged in parallel. In addition, an exposure device 16 is arranged adjacent to the interface block 15.

In this embodiment, a substrate W that has been carried into the indexer block 9 is transported to the anti-reflection film processing block 10 by way of the development processing block 12 and the resist cover film removal block 14. The substrate W is subjected to given processing in the anti-reflection film processing block 10, and then transported to the resist film processing block 11.

The substrate W is subjected to given processing in the resist film processing block 11, and then transported to the resist cover film processing block 13. The substrate W is subjected to given processing in the resist cover film processing block 13, and then transported to the interface block 15.

The substrate W is subjected to given processing in the interface block 15, and then transported to the exposure device 16. The substrate W is subjected to given processing by the exposure device 16, and then transported to the resist cover film processing block 13 by way of the interface block 15.

The substrate W is subjected to a post-exposure bake in the resist cover film processing block 13, and then transported to the resist cover film removal block 14 by way of the resist film processing block 11 and the anti-reflection film processing block 10. The substrate W is subjected to given processing in the resist cover film removal block 14, and then transported to the development processing block 12.

The substrate W is subjected to given processing in the development processing block 12, and then transported to the indexer block 9. Each of the processings to the substrate W in the substrate processing apparatus 500 is thus completed.

Eighth Embodiment

Figure 11:
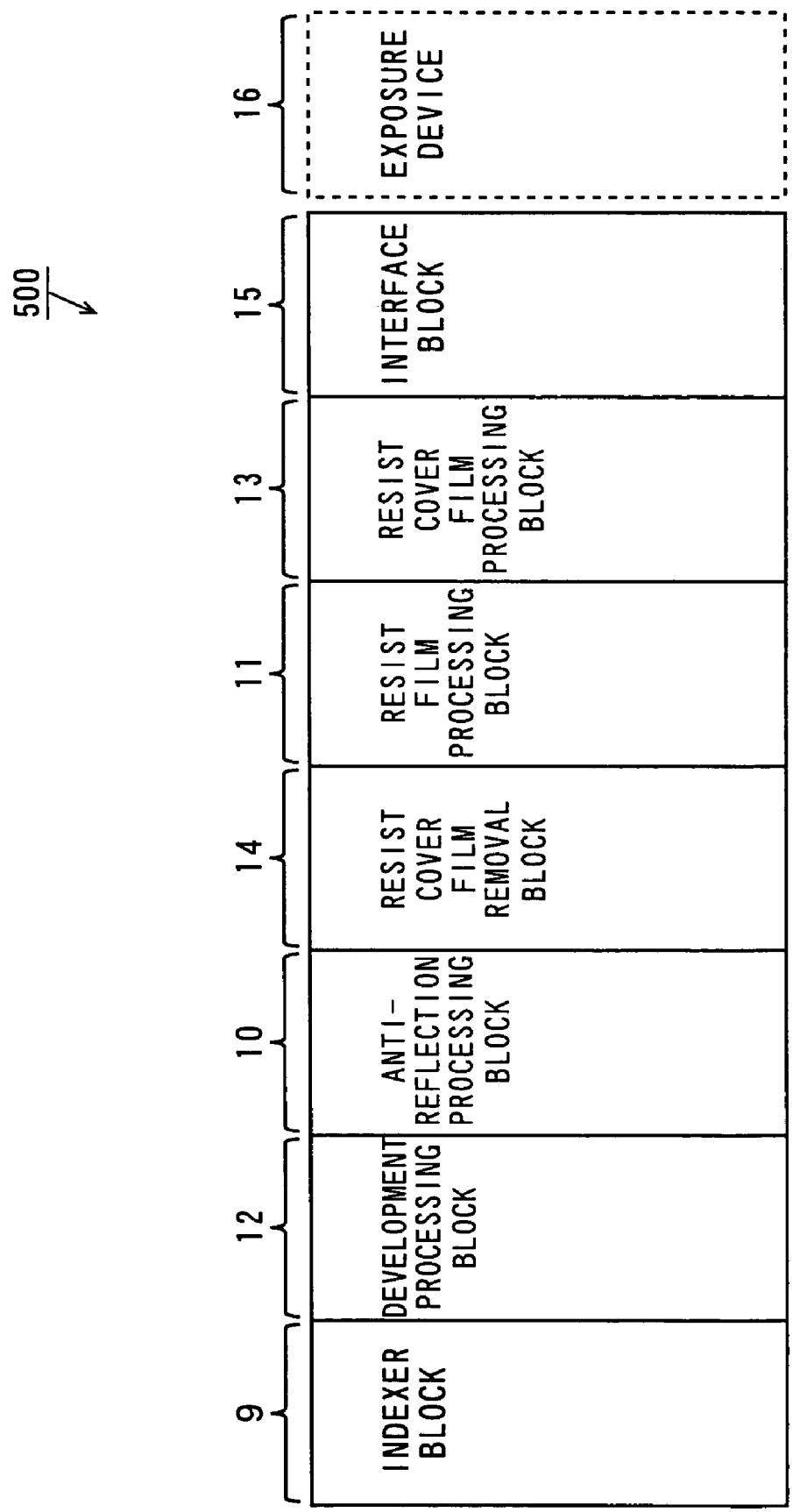
FIG. 11 is a schematic plan view of a substrate processing apparatus according to an eighth embodiment of the invention.

FIG. 11 is a schematic plan view of a substrate processing apparatus according to the eighth embodiment of the invention.

As shown in FIG. 11, in the substrate processing apparatus according to the eighth embodiment, the indexer block 9, the development processing block 12, the anti-reflection film processing block 10, the resist cover film removal block 14, the resist film processing block 11, the resist cover film processing block 13, and the interface block 15 are sequentially arranged in parallel. In addition, an exposure device is arranged adjacent to the interface block 15.

In this embodiment, a substrate W that has been carried into the indexer block 9 is transported to the anti-reflection film processing block 10 by way of the development processing block 12. The substrate W is subjected to given processing in the anti-reflection film processing block 10, and then transported to the resist film processing block 11 by way of the resist cover film removal block 14.

The substrate W is subjected to given processing in the resist film processing block 11, and then transported to the resist cover film processing block 13. The substrate W is subjected to given processing in the resist cover film processing block 13, and then transported to the interface block 15.

The substrate W is subjected to given processing in the interface block 15, and then transported to the exposure device 16. The substrate W is subjected to given processing-by the exposure device 16, and then transported to the resist cover film processing block 13 by way of the interface block 15.

The substrate W is subjected to a post-exposure bake in the resist cover film processing block 13, and then transported to the resist cover film removal block 14 by way of the resist film processing block 11.

The substrate W is subjected to given processing in the resist cover film removal block 14, and then transported to the development processing block 12 by way of the anti-reflection film processing block 10.

The substrate W is subjected to given processing in the development processing block 12, and then transported to the indexer block 9. Each of the processings to the substrate W in the substrate processing apparatus 500 is thus completed.

Ninth Embodiment

FIG. 12 is a schematic plan view of a substrate processing apparatus according to the ninth embodiment of the invention.

As shown in FIG. 12, in the substrate processing apparatus according to the ninth embodiment, the indexer block 9, the development processing block 12, the anti-reflection film processing block 10, the resist film processing block 11, the resist cover film removal block 14, the resist cover film processing block 13, and the interface block 15 are sequentially arranged in parallel. In addition, an exposure device 16 is arranged adjacent to the interface block 15.

In this embodiment, a substrate W that has been carried into the indexer block 9 is transported to the anti-reflection film processing block 10 by way of the development processing block 12. The substrate W is subjected to given processing in the anti-reflection film processing block 10, and then transported to the resist film processing block 11.

The substrate W is subjected to given processing in the resist film processing block 11, and then transported to the resist cover film processing block 13 by way of the resist cover film removal block 14. The substrate W is subjected to given processing in the resist cover film processing block 13, and then transported to the interface block 15.

The substrate W is subjected to given processing in the interface block 15, and then transported to the exposure device 16. The substrate W is subjected to given processing by the exposure device 16, and then transported to the resist cover film processing block 13 by way of the interface block 15.

The substrate W is subjected to a post-exposure bake in the resist cover film processing block 13, and then transported to the resist cover film removal block 14. The substrate W is subjected to given processing in the resist cover film removal block 14, and then transported to the development processing block 12 by way of the resist film processing block 11 and the anti-reflection film processing block 10.

The substrate W is subjected to given processing in the development processing block 12, and then transported to the indexer block 9. Each of the processings to the substrate W in the substrate processing apparatus 500 is thus completed.

Tenth Embodiment

Figure 13:
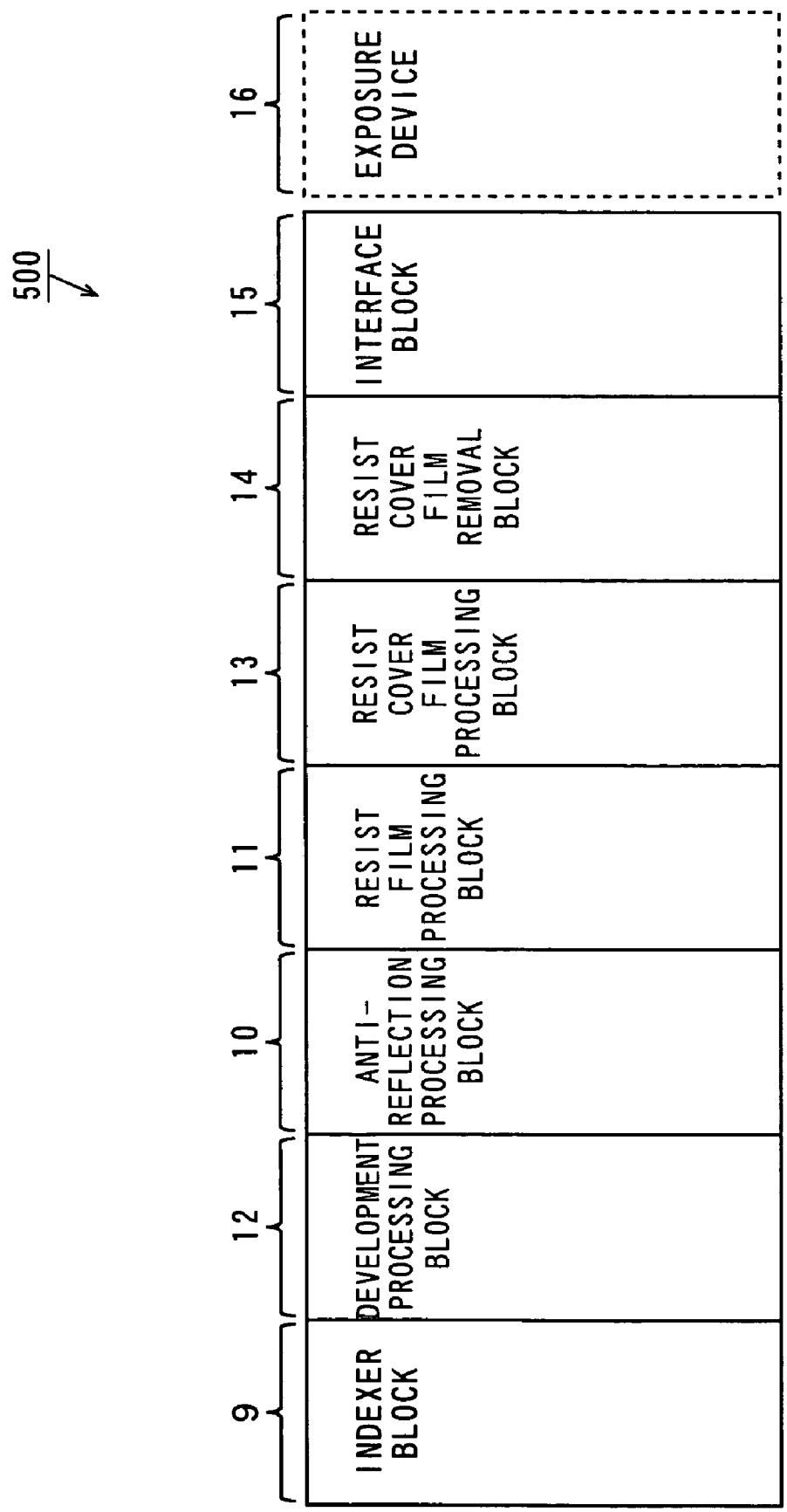
FIG. 13 is a schematic plan view of a substrate processing apparatus according to a tenth embodiment of the invention.

FIG. 13 is a schematic plan view of a substrate processing apparatus according to the tenth embodiment of the invention.

As shown in FIG. 13, in the substrate processing apparatus according to the tenth embodiment, the indexer block 9, the development processing block 12, the anti-reflection film processing block 10, the resist film processing block 11, the resist cover film processing block 13, the resist cover film removal block 14, and the interface block 15 are sequentially arranged in parallel. In addition, an exposure device 16 is arranged in parallel to the interface block 15.

In this embodiment, a substrate that has been carried into the indexer block 9 is transported to the anti-reflection film processing block 10 by way of the development processing block 12. The substrate W is subjected to given processing in the anti-reflection film processing block 10, and then transported to the resist film processing block 11.

The substrate W is subjected to given processing in the resist film processing block 11, and then transported to the resist cover film processing block 13. The substrate W is subjected to given processing in the resist cover film processing block 13, and then transported to the interface block 15 by way of the resist cover film removal block 14.

The substrate W is subjected to given processing in the interface block 15, and then transported to the exposure device 16. The substrate W is subjected to given processing by the exposure device 16, and then transported to the resist cover film removal block 14 by way of the interface block 15.

The substrate W is subjected to given processing including PEB in the resist cover film removal block 14, and then transported to the development processing block 12 by way of the resist cover film processing block 13, the resist film processing block 11, and the anti-reflection film processing block 10.

The substrate W is subjected to given processing in the development processing block 12, and then transported to the indexer block 9. Each of the processings to the substrate W in the substrate processing apparatus 500 is thus completed.

(Effects of Second to Tenth Embodiments)

As described above, similarly to the substrate processing apparatus according to the first embodiment, in the substrate processing apparatus 500 according to each of the second to tenth embodiments, a resist cover film is formed over a resist film formed on a substrate W in the resist cover film processing block 13 before the substrate W is subjected to exposure processing by the exposure device 16. Even if the substrate W contacts a liquid in the exposure device 16 in this case, the resist cover film prevents the resist film from contacting the liquid, so as to prevent a component of the resist from being eluted in the liquid. This reduces contamination in the exposure device 16 while preventing the component of the resist from remaining on a surface of the substrate W. This results in reduced processing defects in substrates W that may be generated in the exposure device 16.

Moreover, the resist cover film is removed in the resist cover film removal block 14 before the substrate W is subjected to development processing in the development processing block 12. This ensures the removal of the resist cover film before the development processing, allowing the development processing to be reliably applied to the substrate W.

Furthermore, in each of the seventh to tenth embodiments, the development processing block 12 is arranged adjacent to the indexer block 9. Usually, organic solvents are used as the coating liquid and the stripping liquid in the processing blocks except the development processing block 12. It is thus necessary to use separate pipes for discharging the liquid from the development processing block 12 and for discharging the liquids from the other processing blocks. For this reason, providing the development processing block 12 adjacent to the indexer block 9 allows the plurality of processing blocks except the development processing block 12 to be arranged adjacent to one another, thereby simplifying the configuration of the piping.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A substrate processing apparatus that is arranged adjacent to an exposure device, comprising:

a processing section for applying processing to a substrate; and an interface that is provided on one end of said processing section for exchanging the substrate between said processing section and said exposure device, wherein said interface includes a transport device that transports the substrate between said processing device, and said processing section includes:

a first processing unit that forms a photosensitive film made of a photosensitive material on the substrate;

a second processing unit that forms a protective film for protecting said photosensitive film on the substrate before exposure processing by said exposure device;

a third processing unit that applies development processing to the substrate after the exposure processing by said exposure device;

a first processing block that includes said first processing unit, a first thermal processing unit that thermally treats the substrate, and a first transport unit that transports the substrate;

a second processing block that includes said second processing unit, a second thermal processing unit that thermally treats the substrate, and a second transport unit that transports the substrate; and a third processing block that includes said third processing unit, a third thermal processing unit that thermally treats the substrate, and a third transport unit that transports the substrate; and said transport device includes a transport mechanism configured to receive the substrate from and transfer the substrate to said exposure device, wherein said transport mechanism has a first holder configured to hold and transport the substrate before the exposure processing by said exposure device, and a second holder configured to hold and transport the substrate after the exposure processing by said exposure device, and said second holder is provided below said first holder.

2. The substrate processing apparatus according to claim 1, wherein said processing section further comprises a fourth processing unit that removes said protective film after the exposure processing by said exposure device and before the development processing by said third processing unit.

3. The substrate processing apparatus according to claim 2, wherein said processing section further comprises:

a fourth processing block that includes said fourth processing unit and a fourth transport unit that transports the substrate.

4. The substrate processing apparatus according to claim 1, wherein said third processing block is arranged adjacent to said interface.

5. The substrate processing apparatus according to claim 1, wherein said protective film made of flouroresin.

6. The substrate processing apparatus according to claim 1, wherein said interface further includes a fifth processing unit that applies given processing to the substrate and a platform on which the substrate is temporarily mounted, said transport device further includes:

a fifth transport unit that transports the substrate between said processing section, said fifth processing unit, and said platform; and said transport mechanism includes a sixth transport unit that transports the substrate between said platform and said exposure device.

7. The substrate processing apparatus according to claim 6, wherein said fifth transport unit has a third holder configured to hold and transport the substrate before the exposure processing by said exposure service, and a fourth holder configured to hold and transport the substrate after the exposure processing by said exposure device.

8. The substrate processing apparatus according to claim 7, wherein said fourth holder is provided below said third holder.

9. The substrate processing apparatus according to claim 6, wherein said fifth processing unit includes an edge exposure unit that subjects a peripheral portion of the substrate to exposure.

10. A substrate processing method for processing a substrate in a substrate processing apparatus that is arranged adjacent to an exposure device, and comprises a first processing unit, a second processing unit, a third processing unit, and a fourth processing unit, the method comprising the steps of:

forming a photosensitive film made of a photosensitive material on the substrate by said first processing unit before exposure processing by said exposure device;

forming a protective film for protecting said photosensitive film on the substrate by said second processing unit before the exposure processing by said exposure device;

holding the substrate before the exposure processing by said exposure device by a first holder of a transport mechanism to transport the substrate to said exposure device;

holding the substrate after the exposure processing by said exposure device by a second holder provided below said first holder of said transport mechanism, to transport the substrate from said exposure device;

applying development processing to the substrate by said third processing unit after the exposure processing by said exposure device; and removing said protective film by said fourth processing unit after the exposure processing by said exposure device and before the development processing by said third processing unit.

* * * * *